(12) United States Patent
Park

(10) Patent No.: US 6,914,286 B2
(45) Date of Patent: Jul. 5, 2005

(54) SEMICONDUCTOR MEMORY DEVICES USING SIDEWALL SPACERS

(75) Inventor: Byung-jun Park, Kyungki-do (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/370,551

(22) Filed: Feb. 20, 2003

(65) Prior Publication Data

US 2004/0000684 A1 Jan. 1, 2004

(30) Foreign Application Priority Data

Jun. 27, 2002 (KR) ................................ 10-2002-0036414
Jun. 28, 2002 (KR) ................................ 10-2002-0037059

(51) Int. Cl.⁷ .............................................. H01L 29/72
(52) U.S. Cl. ...................... 257/304; 257/305; 257/307; 257/310
(58) Field of Search ................................ 257/304, 305, 257/307, 310

(56) References Cited

U.S. PATENT DOCUMENTS

| 5,126,280 A | 6/1992 | Chan et al. |
| 5,554,556 A | 9/1996 | Ema |
| 5,721,154 A | 2/1998 | Jeng |
| 5,753,419 A | 5/1998 | Misium |
| 5,854,105 A | 12/1998 | Tseng |
| 5,966,600 A | 10/1999 | Hong |
| 6,025,624 A * | 2/2000 | Figura .......................... 257/306 |
| 6,380,576 B1 | 4/2002 | Tran |
| 2003/0104701 A1 | 6/2003 | Wang et al. |

FOREIGN PATENT DOCUMENTS

| DE | 42 03 400 A1 | 8/1992 |
| JP | 9-116117 A | 5/1997 |

OTHER PUBLICATIONS

Combined Search and Examination Report Under Sections 17 and 18(3), UK Application No. GB 0314707.1, Dec. 19, 2003.

Translation of an Official Letter as issued by the German Patent and Trademark Office, Official File No. 103 27 945.8–33, Nov. 2, 2004.

Notice to Submit Response, KR Application No. 2002–0037059, Jul. 30, 2004.

* cited by examiner

*Primary Examiner*—Edward Wojciechowicz
(74) *Attorney, Agent, or Firm*—Myers Bigel Sibley & Sajovec

(57) ABSTRACT

Storage nodes for semiconductor memory devices may be fabricated by repeatedly forming conductive and insulating spacers on mold oxide layer pattern sidewalls, to thereby obtain fine line patterns which can increase the surface area of the storage node electrodes. Supporters also may be provided that are configured to support at least one free-standing storage node electrode, to thereby reduce or prevent the storage node electrode from falling or bending towards an adjacent storage node electrode.

20 Claims, 34 Drawing Sheets

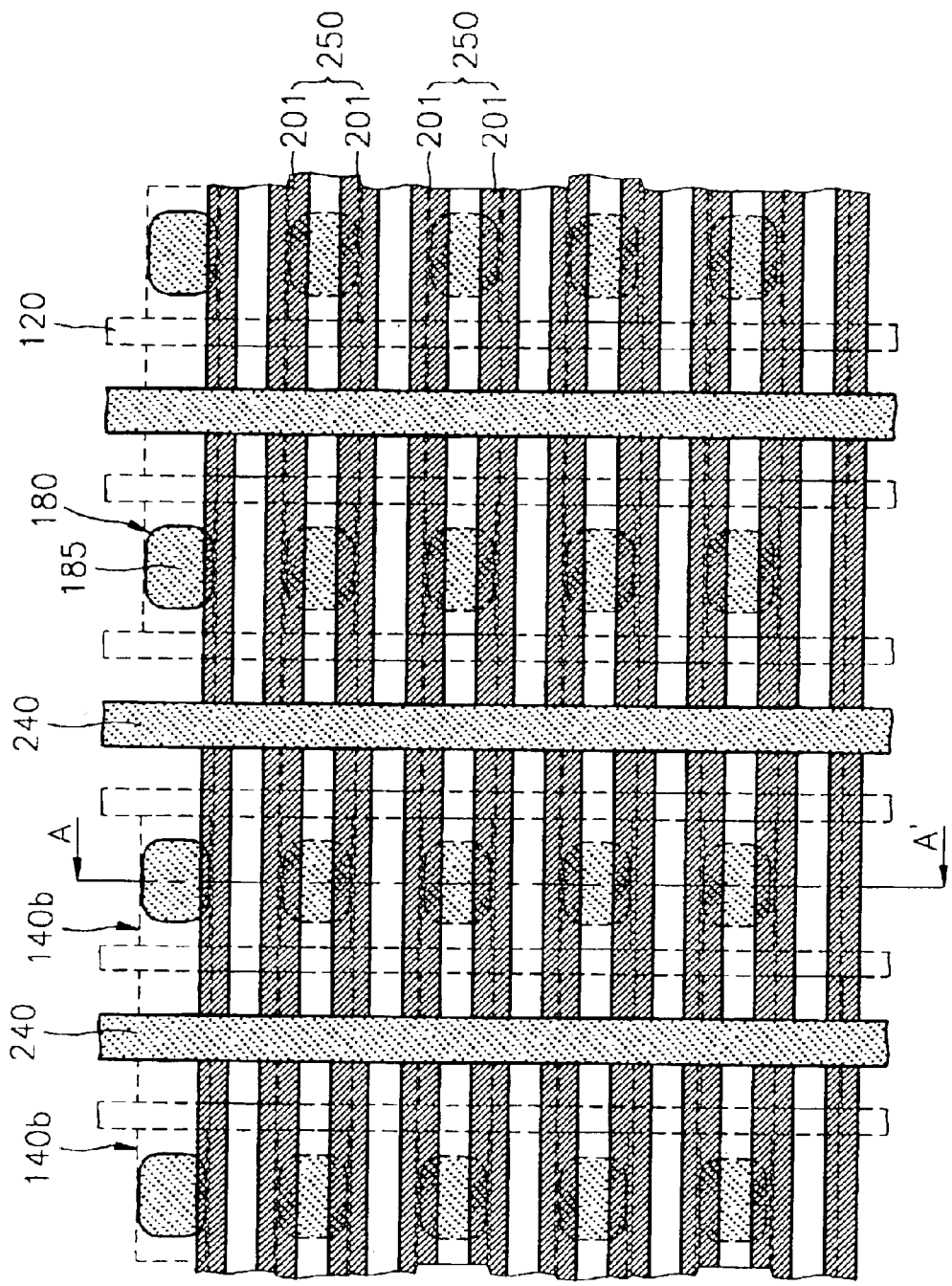

SEMICONDUCTOR MEMORY DEVICES USING SIDEWALL SPACERS

RELATED APPLICATION

This application claims the benefit of Korean Patent Application No. 2002-0036414, filed Jun. 27, 2002, the disclosure of which is hereby incorporated herein by reference in its entirety as if set forth fully herein.

FIELD OF THE INVENTION

The present invention relates to semiconductor memory devices and methods for manufacturing the same, and more particularly to storage nodes for semiconductor memory devices and methods for manufacturing the same.

BACKGROUND OF THE INVENTION

As semiconductor memory devices have become highly integrated, the areas of unit cells and the distances between cells may be reduced. However, capacitors having a large capacitance within small areas are desired, to provide predetermined capacitances. As is well known to those having skill in the art, semiconductor memory device capacitors include a lower electrode, also referred to as a storage node electrode, an upper electrode, also referred to as a plate electrode, and a dielectric layer therebetween. Conventional methods for securing large capacitances of the capacitors include using a high dielectric material as the dielectric layer, reducing the thickness of a dielectric layer, and/or increasing the surface area of storage node electrodes of the capacitors.

A method for increasing the surface area of the storage node electrodes includes forming three-dimensional storage node electrodes, for example, cylindrical or concave electrodes.

FIG. 1 is a sectional view illustrating conventional concave storage node electrodes.

Referring to FIG. 1, an interlevel insulating layer 12 is formed on a semiconductor substrate 10 having circuit devices (not shown), such as MOS transistors. The interlevel insulating layer 12 includes storage node contact plugs 14 that are widely known to connect a source region (not shown) of a selected MOS transistor with storage node electrodes 16, which will be formed in a subsequent process. Thereafter, the cup-shaped concave storage node electrodes 16 are formed on the predetermined portions of the storage node contact plugs 14 and the interlevel insulating layer 12. A method for forming the concave storage node electrodes 16 is as follows. First, a mold oxide layer (not shown) having a predetermined thickness is deposited on the interlevel insulating layer 12 including the storage node contact plugs 14. The mold oxide layer is etched into hole shapes until exposing the storage node contact plugs 14, thereby defining a region for forming the storage node electrodes. Thereafter, a conductive layer (not shown) and a node isolation insulating layer (not shown) are subsequently formed on the mold oxide layer so as to contact the exposed storage node contact plugs 14. The conductive layer and the node isolation insulating layer are chemical mechanical polished to expose the surface of the mold oxide layer. Thereafter, the node isolation insulating layer and the mold oxide layer are removed by a conventional method so that the concave storage node electrodes 16 are formed.

However, the concave storage node electrodes formed by the above-described method may have the following problems.

In order to manufacture the storage node electrodes having large capacitance, the height of the storage node electrodes may need to be increased within a limited area. In addition, in order to increase the height of the storage node electrodes, the thickness of the mold oxide layer may need to be increased. In this case, when the mold oxide layer is etched to define the region for forming the storage node electrodes, a large slope may occur on the sidewalls of the holes, and the critical dimension of the exposed storage node contact holes may be reduced. Accordingly, the lower portions of the thin and high storage node electrodes may become narrower so that the storage node electrodes may become unstable. In addition, the distance between adjacent storage node electrodes may be reduced so that it may be difficult to provide insulation between the storage node electrodes.

Furthermore, due to thermal stress generated in subsequent processes, some of the weak storage node electrodes may fall or break and generate bridges between unit storage node electrodes, thereby causing defects in the device.

SUMMARY OF THE INVENTION

Some embodiments of the present invention provide a semiconductor memory device comprising a semiconductor substrate, an interlevel insulating layer on the semiconductor substrate, storage node contact plugs in the interlevel insulating layer, and storage node electrodes, which comprise a plurality of conductive line patterns separated in predetermined intervals while having a predetermined height, contacting the storage node contact plugs, wherein, the storage node electrodes are separated by insulating line patterns between selected storage node electrodes in units of a unit cell of the memory device.

Other embodiments of the present invention provide a semiconductor memory device comprising an interlevel insulating layer on a semiconductor substrate including a plurality of active regions, a plurality of word line structures passing over the active regions, source and drain regions on the active regions at respective sides of the word line structures, and a plurality of bit line structures crossing the word line structures, electrically connecting to the drain regions, and passing between the active regions; etch stoppers on the interlevel insulating layer; storage node contact plugs formed in the interlevel insulating layer and the etch stoppers; storage node electrodes, which comprise a plurality of conductive line patterns separated in predetermined intervals while having a predetermined height, contacting to the storage node contact plugs; and supporters between the storage node electrodes and extending perpendicular to an extending direction of the line patterns of the storage node electrodes. In these embodiments, the plurality of line patterns are formed into straight lines.

Other embodiments of the present invention provide a semiconductor memory device comprising an interlevel insulating layer on a semiconductor substrate including a plurality of active regions, a plurality of word line structures passing over the active regions, source and drain regions on the active regions at respective sides of the word line structures, and a plurality of bit line structures crossing the word line structures, electrically connecting to the drain regions, and passing between the active regions; etch stoppers on the interlevel insulating layer; storage node contact plugs in the interlevel insulating layer and the etch stoppers; storage node electrodes, which comprise a plurality of conductive line patterns separated in the same intervals while having a specific height, contacting the storage node contact plugs; and supporters between the storage node electrodes while being perpendicular to an extending direction of the line patterns of the storage node electrodes. In these embodiments, the plurality of line patterns are formed in the shape of waves in a plan view.

According to other embodiments of the present invention, there are provided methods of manufacturing a semiconductor memory device. In these methods, an interlevel insulating layer is deposited on a semiconductor substrate, and a plurality of storage node contact plugs are formed in the interlevel insulating layer in specific intervals. Thereafter, mold oxide layer patterns are formed on the interlevel insulating layer in specific intervals to expose the storage node contact plugs, and the spaces between the mold oxide layer patterns are filled by alternately forming conductive line patterns and insulating line patterns, repeatedly, on the sidewalls of the mold oxide layer patterns. Grooves are formed perpendicular to the mold oxide layer patterns by etching portions of the mold oxide layer patterns, the conductive line patterns, and the insulating line patterns. Storage node electrodes are formed by selectively removing the mold oxide layer patterns and the insulating line patterns.

According to yet other embodiments of the present invention, there are provided methods for manufacturing a semiconductor memory device. In these methods, a semiconductor substrate, which includes a plurality of active regions, a plurality of word line structures passing over the active regions, source and drain regions formed on the active regions at respective sides of the word line structures, and a plurality of bit line structures crossing the word line structures, electrically connecting to the drain regions, and passing between the active regions, is prepared. An interlevel insulating layer is formed on the semiconductor substrate, etch stoppers are formed on the interlevel insulating layer, and storage node contact plugs are formed in the interlevel insulating layer and the etch stoppers at specific intervals. Thereafter, a plurality of mold oxide layer patterns are formed on the etch stoppers at specific intervals to expose the storage node contact plugs. The spaces between the mold oxide layer patterns are filled by alternately forming at least one conductive line pattern and insulating line pattern on the sidewalls of the mold oxide layer patterns in order to follow the shape of the mold oxide layer patterns. Grooves are formed perpendicular to the mold oxide layer patterns by etching portions of the mold oxide layer patterns, the conductive line patterns, and the insulating line patterns. Thereafter, supporters are formed in the grooves, and storage node electrodes are formed by selectively removing the mold oxide layer patterns and the insulating line patterns. In these embodiments, the mold oxide layer patterns extend into straight lines and the mold oxide layer patterns and the supporters separate the storage node electrodes in units of each cell.

According to still other embodiments of the present invention, there are provided methods for manufacturing a semiconductor memory device. In these methods, a semiconductor substrate, which includes a plurality of active regions, a plurality of word line structures passing over the active regions, source and drain regions formed on the active regions at respective sides of the word line structures, and a plurality of bit line structures crossing the word line structures, electrically connecting to the drain regions, and passing between the active regions, is prepared. An interlevel insulating layer is formed on the semiconductor substrate, and etch stoppers are formed on the interlevel insulating layer. Thereafter, storage node contact plugs are formed in the interlevel insulating layer and the etch stoppers at specific intervals, and a plurality of mold oxide layer patterns, which are formed in the shape of waves on a plan view, are formed on the etch stoppers to expose the storage node contact plugs. The spaces between the mold oxide layer patterns are filled by alternately forming at least one conductive line pattern and insulating line pattern on the sidewalls of the mold oxide layer patterns in order to follow the shape of the mold oxide layer patterns. Thereafter, grooves are formed perpendicular to the mold oxide layer patterns by etching portions of the mold oxide layer patterns, the conductive line patterns, and the insulating line patterns. Supporters are formed in the grooves, and storage node electrodes are formed by selectively removing the mold oxide layer patterns and the insulating line patterns. In these embodiments, the mold oxide layer patterns and the supporters separate the storage node electrodes in units of each cell.

Other embodiments of the present invention provide a storage node for a semiconductor memory device which includes a pair of spaced apart mold oxide layer patterns on a semiconductor memory device substrate that defines facing mold oxide layer pattern sidewalls. A pair of first conductive spacers are provided, a respective one of which is on a respective one of the facing mold oxide layer pattern sidewalls and face one another. A pair of first insulating spacer is provided, a respective one of which is on a respective one of the pair of first conductive spacers, opposite the respective one of the facing mold oxide layer pattern sidewalls. A pair of second conductive spacers is provided, a respective one of which is on a respective one of the pair of first insulating spacers, opposite the respective one of the pair of first conductive spacers. At least one second insulating spacer is provided between the pair of second conductive spacers. In some embodiments, a single insulating spacer extends between the pair of second conductive spacers.

Storage nodes may be fabricated according to some embodiments of the present invention by forming spaced apart mold oxide layer patterns on a semiconductor memory device substrate that define facing mold oxide layer pattern sidewalls. A first conductive spacer is formed on each of the facing mold oxide layer pattern sidewalls. A first insulating spacer is formed on each of the first conductive spacers. A second conductive spacer is formed on each of the first insulating spacers and at least a second insulating spacer is formed on the second conductive spacers. In some embodiments, the first conductive spacers, the first insulating spacers and the second conductive spacers are formed by conformally forming a conductive or insulating layer on the facing mold oxide layer pattern sidewalls and on the semiconductor memory device substrate therebetween, and then anisotropically etching the conductive or insulating layer to remove at least some the layer that is on the semiconductor memory device substrate therebetween.

In other embodiments of the invention, a storage node for a semiconductor memory device includes a plurality of freestanding storage node electrodes that project away from a semiconductor memory device substrate by a first distance. A supporter is configured to support at least one of the freestanding storage node electrodes and projects away from the semiconductor memory substrate by a second distance that is less than the first distance. In other embodiments, the plurality of freestanding storage nodes extend along two spaced apart rows, and the supporter extends between the two spaced apart rows. Storage nodes may be fabricated by forming the freestanding storage node electrodes and then forming the supporter to support at least one of the freestanding storage node electrodes.

BRIEF DESCRIPTION OF THE DRAWINGS

FIGS. 2A through 2D are plan views of stages in the manufacture of a semiconductor memory device according to first embodiments of the present invention;

DETAILED DESCRIPTION

Figure 1:
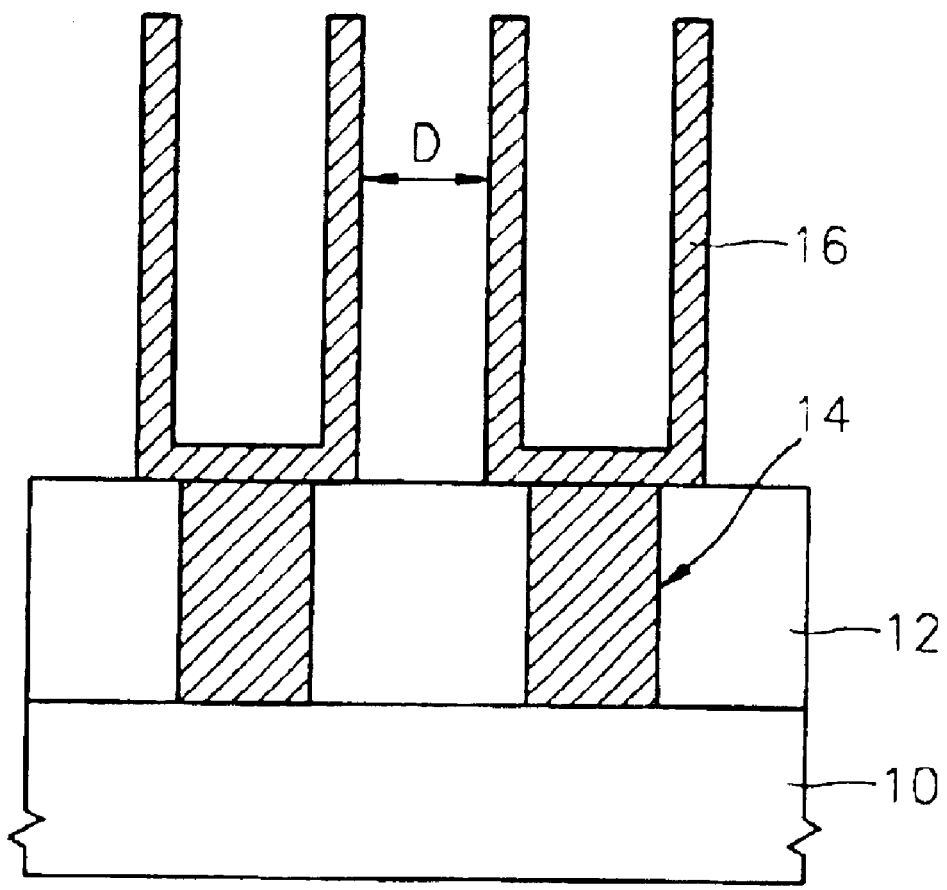
FIG. 1 is a sectional view illustrating a conventional semiconductor memory device having concave storage node electrodes.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

First Embodiments

Figure 2A:
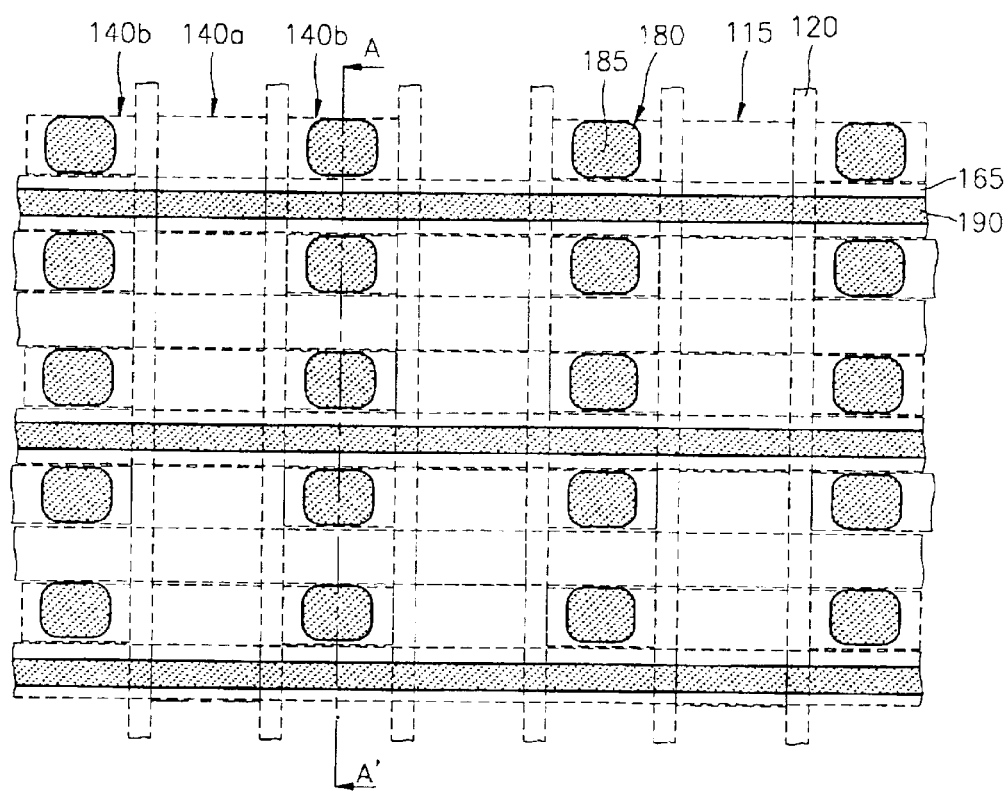
Figure 3A:
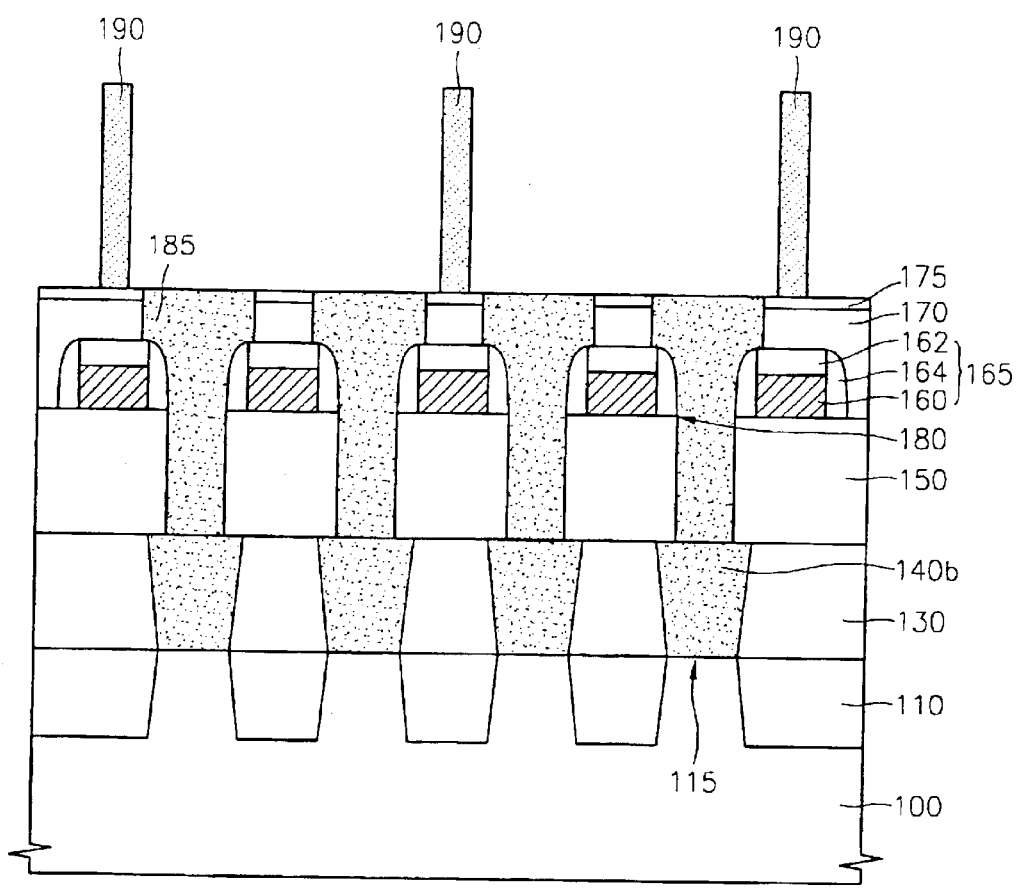
FIGS. 3A through 3C are sectional views of stages in the manufacture of a semiconductor memory device according to the first embodiments of the present invention.

Referring to FIGS. 2A and 3A, an isolation layer 110 is formed in a selected region of a semiconductor substrate 100 by a conventional STI method, thereby defining active regions 115 on which devices will be formed. Here, the semiconductor substrate 100 may be a silicon substrate including P-type or N-type impurities and may include wells in a predetermined region to form a device. The active regions 115, formed in, for example, a bar shape, are spaced apart by a predetermined distance in rows and columns. Here, the active regions 115 are arranged to alternate by each row. In other words, the spaces between the adjacent active regions 115 correspond to the central portions of the active regions of the subsequent row in the direction of the longer axis of the active regions 115. Here, the central portions of the active regions will be drain regions.

Thereafter, word line structures 120 are formed on the semiconductor substrate 100. Here, the word line structures 120 are extended to be parallel with one another while being perpendicular to the longer axis of the active regions 115. In addition, a pair of word line structures 120 may be arranged for each of the active regions 115. Source and drain regions (not shown) are formed in the active regions 115 at both sides of the word line structures 120 by a conventional method.

A first interlevel insulating layer 130 is formed on the semiconductor substrate 100 having the word line structures 120 and on the source and drain regions. First and second contact pads 140a and 140b, which contact the source and drain regions while having the same height as the first interlevel insulating layer 130, are formed in the first interlevel insulating layer 130. A method for forming the first and second contact pads 140a and 140b will now be described. After the first interlevel insulating layer 130 is formed, the first interlevel insulating layer 130 is etched to expose the source and drain regions. A conductive layer, for example, a doped polysilicon layer, is deposited to contact the exposed source and drain regions, and the conductive layer is etched back or chemical mechanical polished so as to expose the surface of the first interlevel insulating layer 130. Accordingly, the first and second contact pads 140a and 140b are formed. Here, the first and second contact pads 140a and 140b contact the drain region and the source regions, respectively.

A second interlevel insulating layer 150 is formed on the first interlevel insulating layer 130 and bit line structures 165 are formed on the second interlevel insulating layer 150. Here, the bit line structure 165 includes a bit line 160, a mask layer 162 formed on the bit line 160, and spacers 164 formed on both walls of the bit line 160 and the mask layer 162. The mask layers 162 and the spacers 164, formed of, for example, silicon nitride layers, are formed to surround the bit lines 160 in order to form self-aligned contact holes when forming storage node contact holes. In addition, in some embodiments, the bit line structures 165 are formed to be perpendicular to the word line structures 120 and that the bit line structures 165 are arranged on the isolation layer 110 between the active regions 115 while being parallel to the longer axis of the active regions. Here, though not shown in the drawings, bit line contact plugs for connecting the first contact pads 140a and the bit line structures 165 are formed in the second interlevel insulating layer 150 by a conventional method, before forming the bit line structures 165.

A third interlevel insulating layer 170 and etch stoppers 175 are sequentially formed on the second interlevel insulating layer 150 having the bit line structures 165. Here, the first through third interlevel insulating layers 130, 150, and 170 may be formed of, for example, insulating layers of the silicon oxide layer group. The etch stoppers 175 are formed of insulating layers, for example, silicon nitride layers, having an etching selectivity different from the etching selectivities of the second and third interlevel insulating layers 150 and 170. The etch stoppers 175, the third interlevel insulating layer 170, and the second interlevel insulating layer 150 are etched to expose the second contact pads 140b, which contact the source regions, so that storage node contact holes 180 are formed. Here, the storage node contact holes 180 are formed by a self-aligning method using the bit line structures 165. Thereafter, a conductive layer, for example, a doped polysilicon layer, is deposited to sufficiently fill the storage node contact holes 180, and the doped polysilicon layer is chemical mechanical polished to expose the etch stoppers 175. Accordingly, storage node contact plugs 185 are formed. Other conventional techniques for forming a semiconductor memory device substrate may be used.

Figure 5:
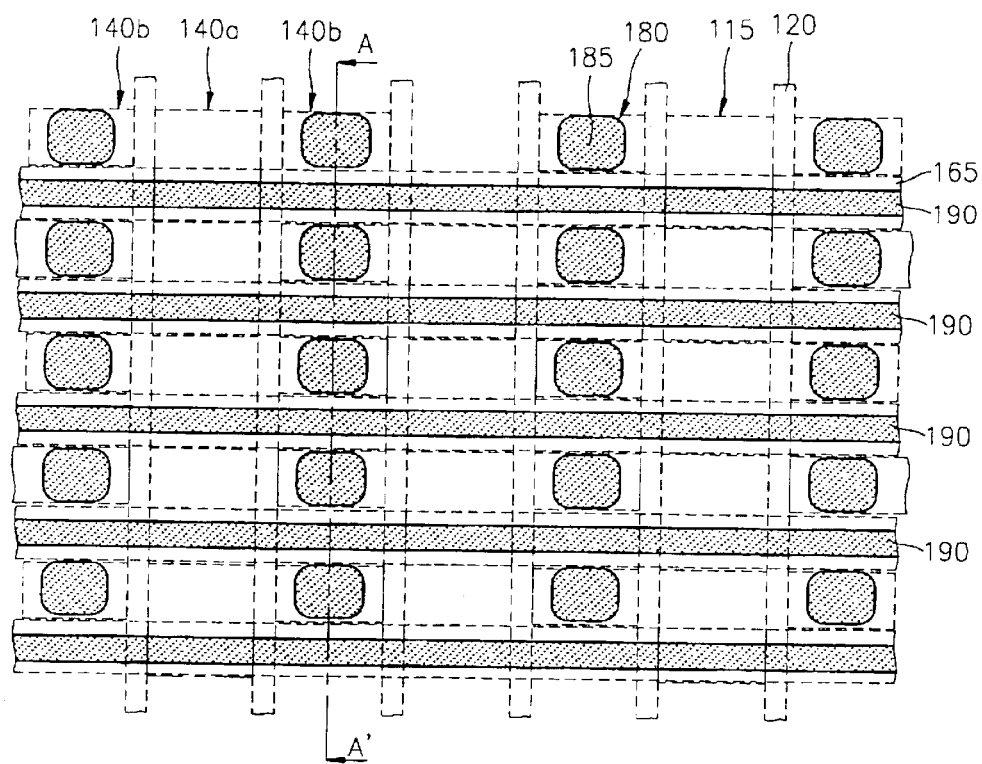
FIG. 5 is a plan view illustrating a modified semiconductor memory device according to the first embodiments of the present invention.

A mold oxide layer is formed on the storage node contact plugs 185 and the etch stoppers 175 to a predetermined thickness. In some embodiments, the mold oxide layer for determining the height of the storage node electrodes is formed to a height higher than the desired height of the storage node electrodes by a predetermined height, considering that the mold oxide layer will be chemical mechanical polished to the predetermined height in the present embodiments. The mold oxide layer is etched to overlap the bit line structures 165 so that mold oxide layer patterns 190 are formed. Here, the mold oxide layer patterns 190 can be formed in predetermined intervals, for example, one-pitch or two-pitch. The mold oxide layer patterns 190 of FIG. 2A are arranged in two-pitch intervals and the mold oxide layer patterns 190 of FIG. 5 are arranged in one-pitch intervals. In this respect, the mold oxide layer patterns 190 in the two-pitch intervals mean that two storage node contact plugs 185 are located between two adjacent mold oxide layer patterns 190. In addition, the line width of the mold oxide layer patterns 190 may be equal to or less than the line width of the bit line structures 165.

Figure 3B:
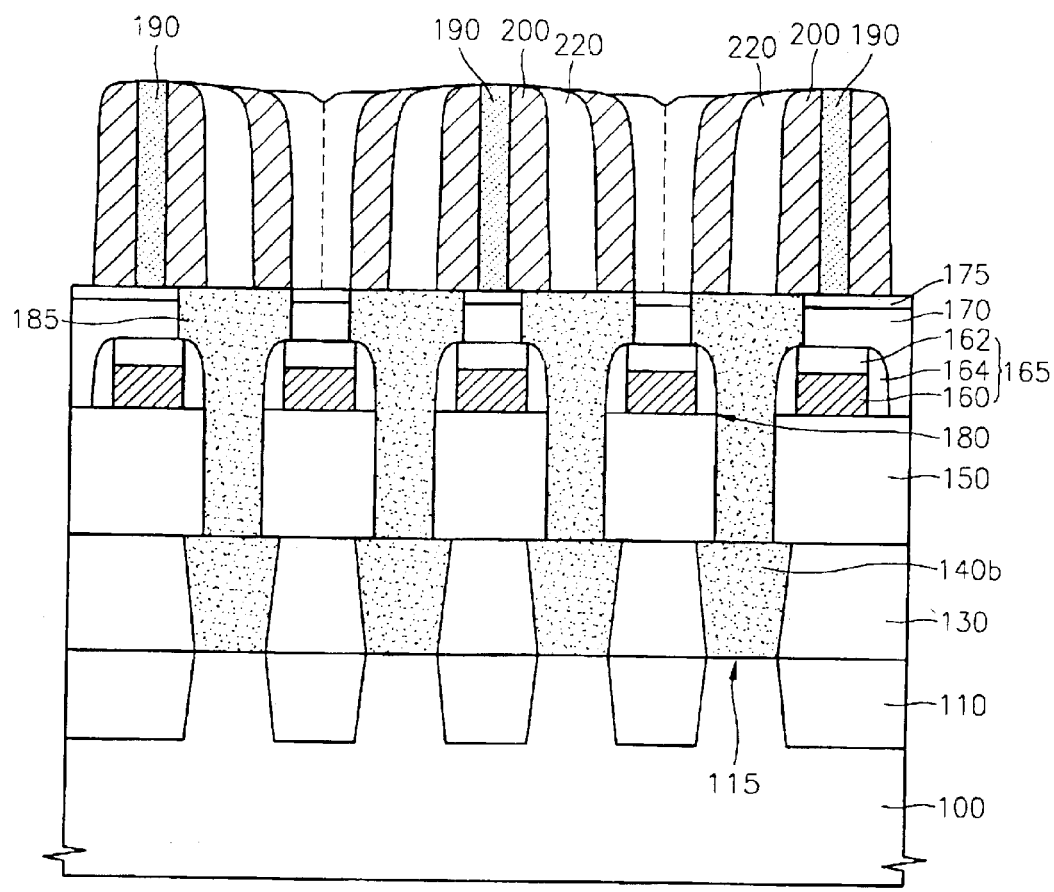

Referring to FIG. 3B, a conductive layer for the storage node electrodes, for example, a polysilicon layer, is deposited on the etch stoppers 175 on which the mold oxide layer patterns 190 are formed. Next, the polysilicon layer is anisotropically etched to form conductive spacers 200 of polysilicon on both walls of the mold oxide layer patterns 190. An insulating layer is deposited on the resultant structure and anisotropically etched to form insulating spacers 220 on the sidewalls of the conductive spacers 200. By repeatedly forming the conductive spacers 200 and the insulating spacers 220, the spaces between the mold oxide layer patterns 190 are filled. Here, in order to separate unit cells, the last spacers formed between the mold oxide layer patterns 190, i.e., the spacers formed at the center points between the mold oxide layer patterns 190, are the insulating spacers 220. In addition, the conductive spacers 200 are formed to contact the node contact plugs 185. In the present embodiments, the spaces between the mold oxide layer patterns 190 are filled by forming the conductive spacers 200 twice and forming the insulating spacers 220 twice; however, the widths and the numbers of the conductive spacers 200 and the insulating spacers 220 can be varied.

Figure 2B:
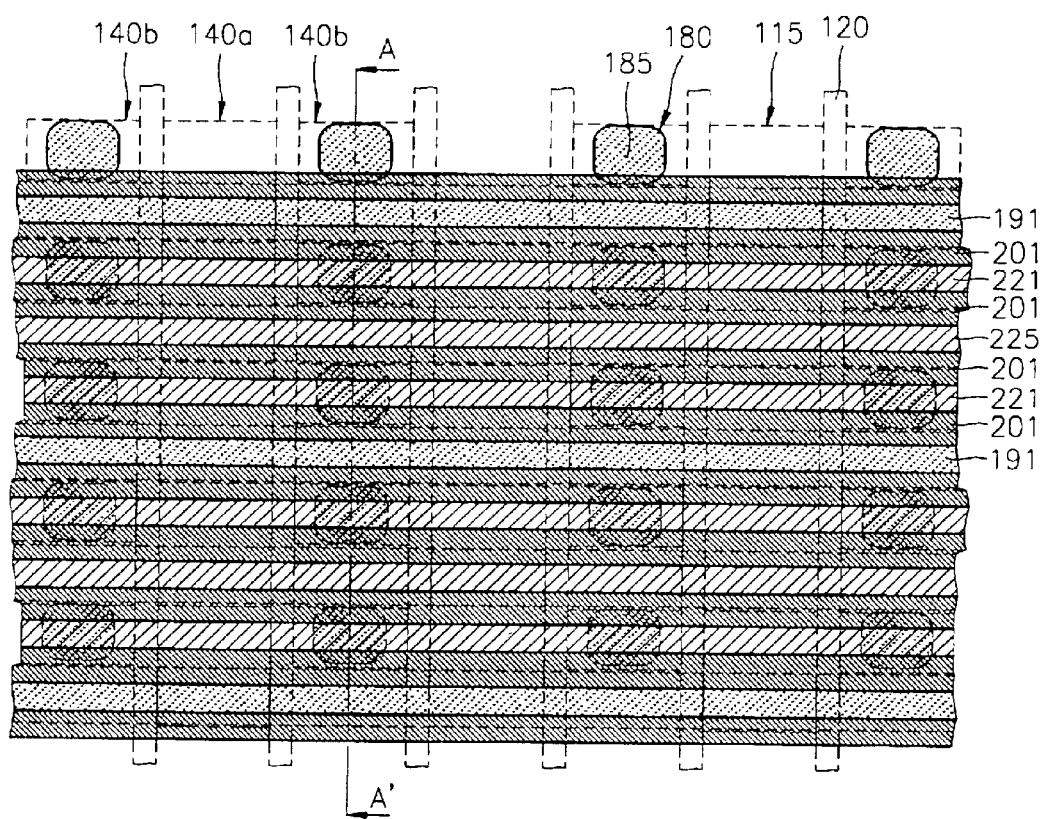
Figure 3C:
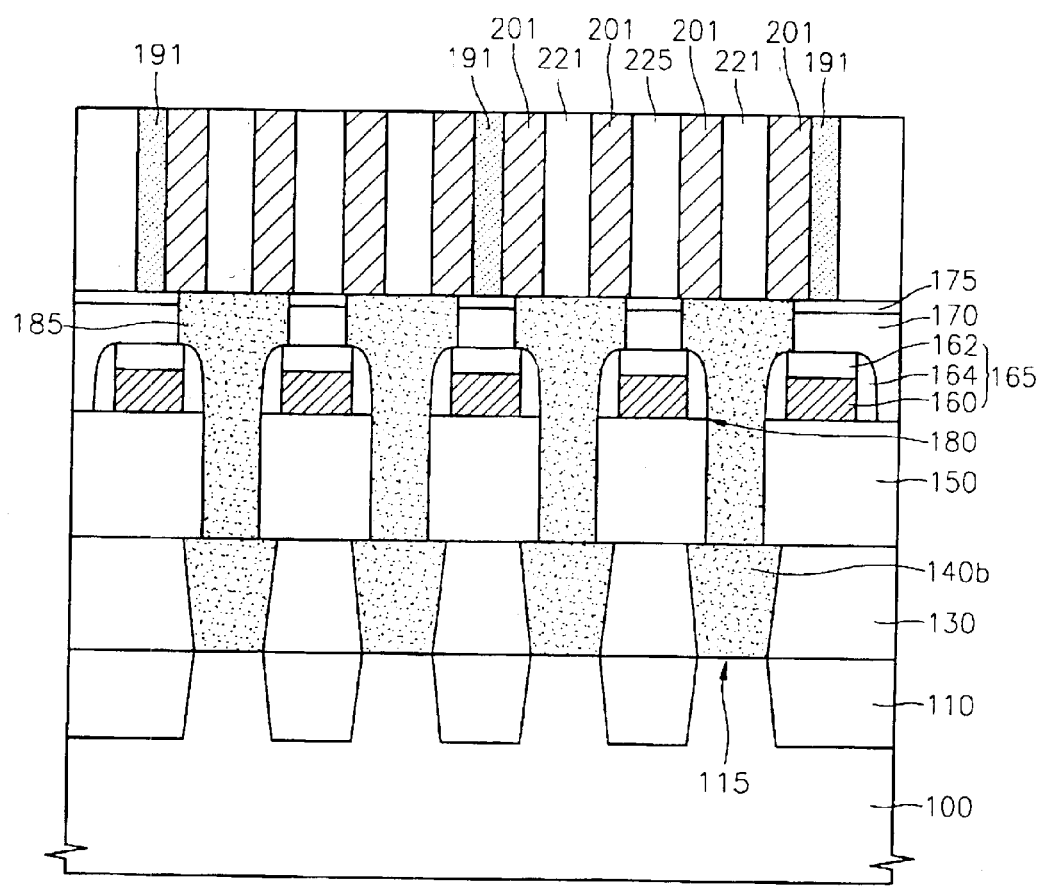

Referring to FIGS. 2B and 3C, the upper surfaces of the mold oxide layer patterns 190, the conductive spacers 200, and the insulating spacers 220 are chemical mechanical polished to planarize the upper surfaces so that conductive line patterns 201 and insulating line patterns 221 and 225 are formed between mold oxide layer patterns 191. Here, reference numeral 191 denotes the mold oxide layer patterns having planarized upper surfaces. And, the conductive line patterns 201 are the conductive spacers 220 having planarized upper surfaces, and the insulating line patterns 221 and 225 are the insulating spacers 220 having planarized upper surfaces. The conductive line patterns 201 respectively contact the storage node contact plugs 185 and the insulating line patterns 221 and 225 insulate the conductive line patterns 201. In particular, the insulating line patterns 225 formed on the etch stoppers 175 separate the conductive line patterns 201 by one pitch, i.e., the size of unit cells, in a direction parallel to the bit line structures 165 while insulating the conductive line patterns 201. In the present embodiments, each of the storage node contact plugs 185 includes, for example, two conductive line patterns 201 and one insulating line pattern 221 therebetween.

Figure 2C:
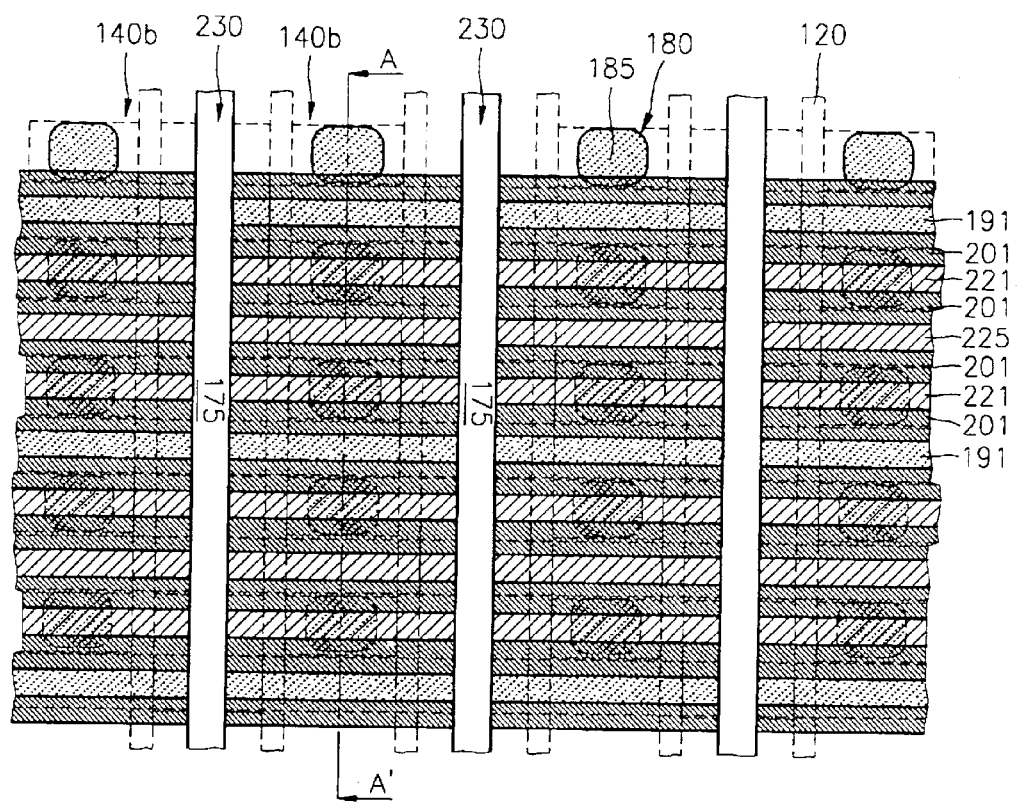

Referring to FIG. 2C, in order to define the storage node electrodes, grooves 230 are formed by patterning portions of the mold oxide layer patterns 191, the conductive line patterns 201, and the insulating line patterns 221 and 225. Here, the grooves 230 extend to be perpendicular to the extending direction of the mold oxide layer patterns 191, i.e., to be parallel to the word line structures 120. The grooves 230 are formed between the word line structures 120 on which the drain regions are formed in order to secure maximum storage node electrode regions. In other words, a couple of word lines 120 are arranged between a couple of adjacent grooves 230 such that the grooves 230 open the etch stoppers 175.

Figure 4:
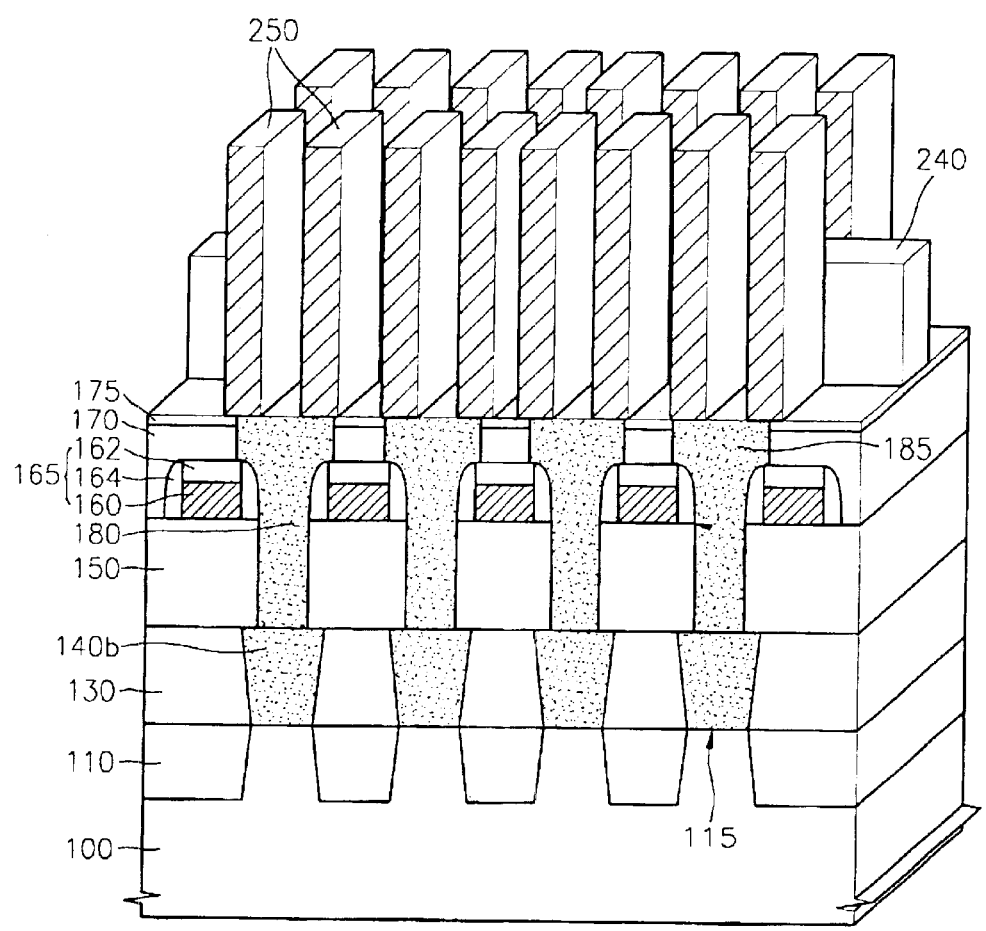
FIG. 4 is a perspective view illustrating a semiconductor memory device according to the first embodiments of the present invention.

Referring to FIGS. 2D and 4, an insulating layer for supporters is deposited to sufficiently bury the grooves 230, and the insulating layer is etched to a height smaller than the height of the conductive line patterns 201 so as to form supporters 240. Here, the insulating layer for supporters is formed of an insulating layer having an etching selectivity different from the etching selectivities of the mold oxide layer patterns 191 and the insulating line patterns 221 and 225. Accordingly, the insulating layer is wet etched to form the supporters 240.

Since the supporters 240 are formed in the grooves 230, the supporters 240 cross through the conductive line patterns 201 so that the supporters 240 separate the conductive line patterns 201 according to cell. Furthermore, the supporters 240 support the conductive line patterns 201, thereby reducing or preventing the conductive line patterns 201 from falling or bending toward the adjacent conductive line patterns 201. In addition, the supporters 240 have a height smaller than the height of the conductive line patterns 201 in order to secure storage node electrode capacitance.

Thereafter, the mold oxide layer patterns 191 and the insulating line patterns 221 and 225 are removed by a conventional wet etching method. Here, since the mold oxide layer patterns 191 and the insulating line patterns 221 and 225 have the etching selectivity different from the etching selectivities of the etch stoppers 175 and the supporters 240, the mold oxide layer patterns 191 and the insulating line patterns 221 and 225 are selectively removed. Thus, the storage node electrodes 250 formed of the plurality of conductive line patterns 201 are completely formed.

The storage node electrodes 250 according to the present embodiment are formed of a plurality of conductive line patterns 201 having a fine line width so as to increase the surface area of the storage node electrodes 250. In addition, the supporters 240 separate and support the storage node electrodes 250 according to cell so as to reduce or prevent the storage node electrodes 250 from falling or bending toward the adjacent storage node electrodes 250. Furthermore, as shown in FIG. 2D, the storage node electrodes 250 are extended to the regions corresponding to the drain regions (not shown) as well as the regions having the bit line structures 165 so as to increase the surface area of the storage node electrodes 250.

Second Embodiments

Figure 6A:
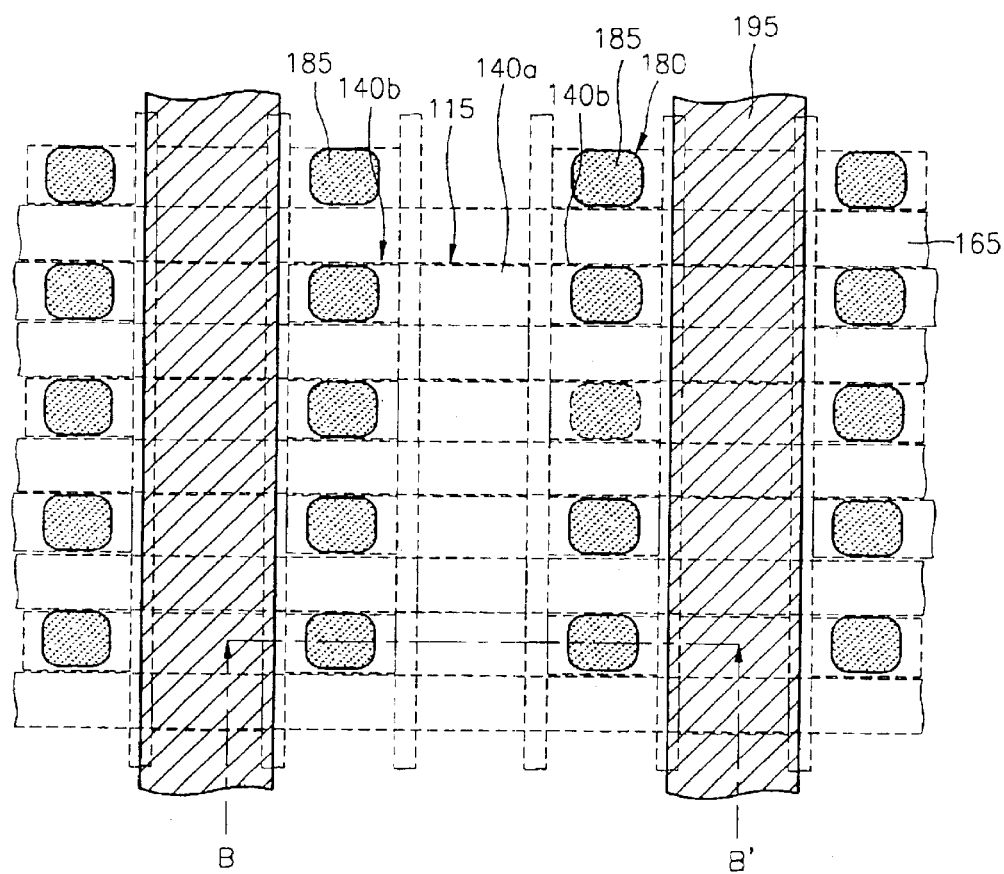
FIGS. 6A through 6D are plan views of stages in the manufacture of a semiconductor memory device according to second embodiments of the present invention.
Figure 7A:
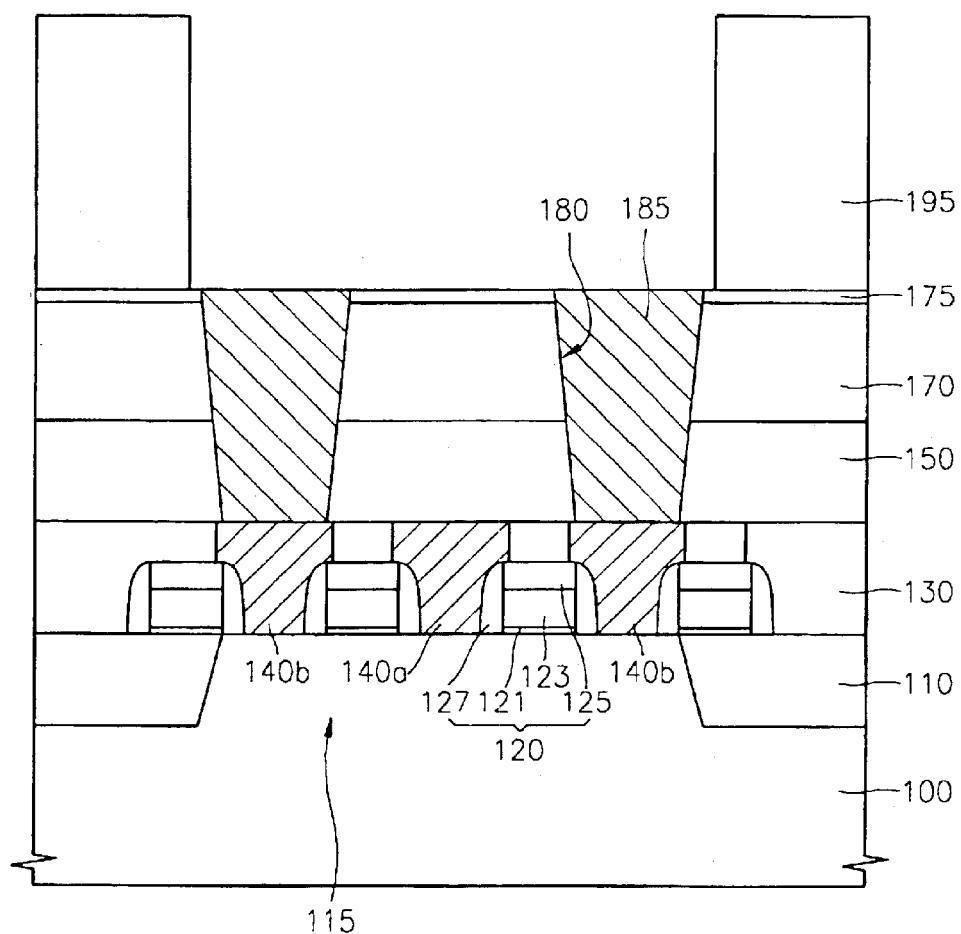
FIGS. 7A and 7B are sectional views of stages in the manufacture of a semiconductor memory device according to the second embodiments of the present invention.

Referring to FIGS. 6A and 7A, an isolation layer 110 is formed on a semiconductor substrate 100 as shown in the first embodiment to define active regions 115. Word line structures 120 are formed on the semiconductor substrate 100 as follows. After subsequently depositing a gate insulating layer 121, word lines 123, and a hard mask layer 125, the layers are patterned to be perpendicular to the longer axis of the active regions 115. Word line spacers 127 are formed on the sidewalls of the patterned hard mask layers 125 and word lines 123 by a conventional method to form the word line structures 120. Here, the hard mask layers 125 and the word line spacers 127 are formed of silicon nitride layers having an etching selectivity different from the etching selectivity of an interlevel insulating layer of a silicon oxide layer group, which will be formed to form self-aligning contact holes in a subsequent process. In addition, the word line structures 120 extend so as to be parallel with one another and a couple of word line structures 120 are arranged on each active region 115. Source and drain regions (not shown), a first interlevel insulating layer 130, contact pads 140a and 140b, a second interlevel insulating layer 170, etch stoppers 175, and storage node contact pads 185 are formed in the active regions 115 at both sides of the word line structures 120 by the method illustrated in the first embodiment.

Figure 9:
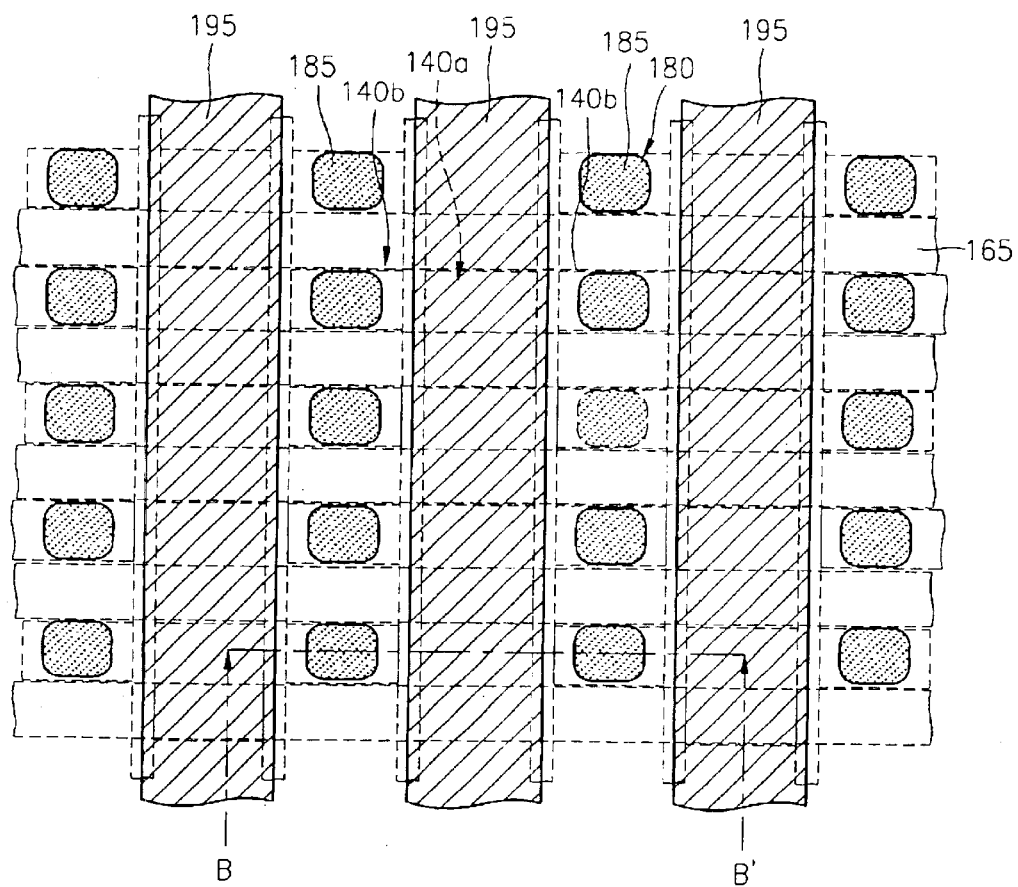
FIG. 9 is a plan view illustrating a modified semiconductor memory device according to the second embodiments of the present invention.

A mold oxide layer is formed on the storage node contact plugs 185 and the etch stoppers 175 to a predetermined thickness. As described above, the mold oxide layer for determining the height of the storage node electrodes is formed to a height higher than the desired height of the storage node electrodes by a predetermined height. The portion of the mold oxide layer is etched to expose the storage node contact plugs 185, thereby forming mold oxide layer patterns 195. In the present embodiments, the mold oxide layer patterns 195 are arranged to be parallel to the word line structures 120 while overlapping the drain regions of the active regions 115. In addition, the mold oxide layer patterns 195 can be formed in predetermined intervals, for example, one-pitch or two-pitch. The mold oxide layer patterns 195 of FIG. 6A are arranged in two-pitch intervals, and the mold oxide layer patterns 195 of FIG. 9 are arranged in one-pitch intervals. Here, the mold oxide layer patterns 195 in the two-pitch intervals mean that two storage node contact plugs 185 are located between two adjacent mold oxide layer patterns 195, and the mold oxide layer patterns 195 in the one-pitch intervals mean that one storage node contact plug 185 is located between two adjacent mold oxide layer patterns 195.

Figure 6B:
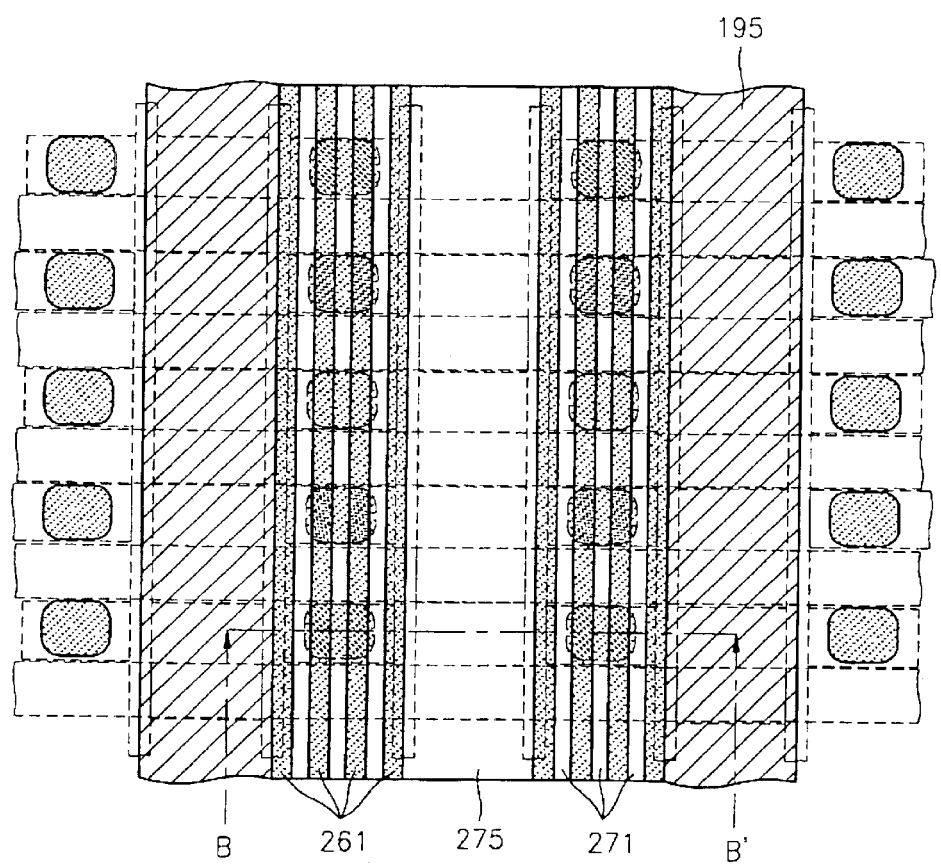
Figure 7B:
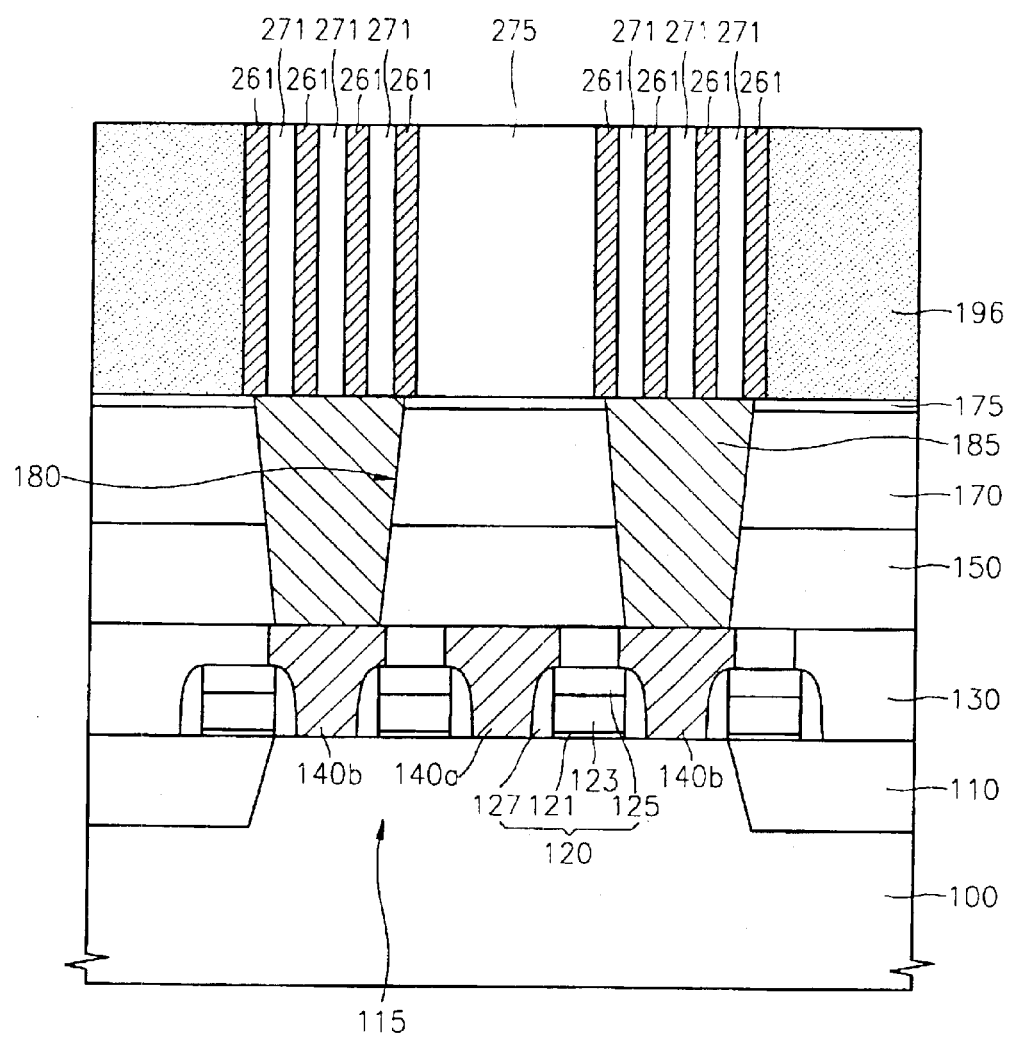

Referring to FIGS. 6B and 7B, a conductive layer for the storage node electrodes, for example, a doped polysilicon layer, is deposited on the etch stoppers 175 on which the mold oxide layer patterns 195 are formed as shown in the first embodiment. The polysilicon layer is anisotropically etched to form conductive spacers (not shown) of polysilicon on the both walls of the mold oxide layer patterns 195. An insulating layer is deposited on the resultant structure and anisotropically etched to form insulating spacers (not shown) on the sidewalls of the conductive spacers. By repeatedly forming the conductive spacers and the insulating spacers, the spaces between the mold oxide layer patterns 195 are filled. Here, the conductive spacers contact the storage node contact plugs 185 and the last spacers are the insulating spacers. The last spacers are formed on the etch stoppers 175 between the storage node contact plugs 185 and the last spacers may have relatively larger line width than the other insulating spacers. In the present embodiments, each of the spaces between the mold oxide layer patterns 195 is filled by forming the conductive spacers four times and forming the insulating spacers four times; however, the widths and the numbers of the conductive spacers and the insulating spacers can be controlled.

The upper surfaces of the mold oxide layer patterns 195, the conductive spacers, and the insulating spacers are chemical mechanical polished to form conductive line patterns 261 and insulating line patterns 271 and 275 between mold oxide layer patterns 196. Here, reference numeral 196 denotes the mold oxide layer patterns with planarized upper surfaces. The conductive line patterns 261, which are the conductive spacers having planarized upper surfaces, contact the storage node contact plugs 185. The insulating line patterns 271 on the storage node contact plugs 185, which are the insulating spacers 220 having planarized upper surfaces, insulate the conductive line patterns 261. In addition, the insulating line patterns 275 formed on the etch stoppers 175 insulate the conductive line patterns 261 and separate the conductive line patterns 261 in a direction parallel to the word line structures 120 by one pitch, i.e., cell unit. In the present invention, four conductive line patterns 261 contact each of the storage node contact plugs 185.

Figure 6C:
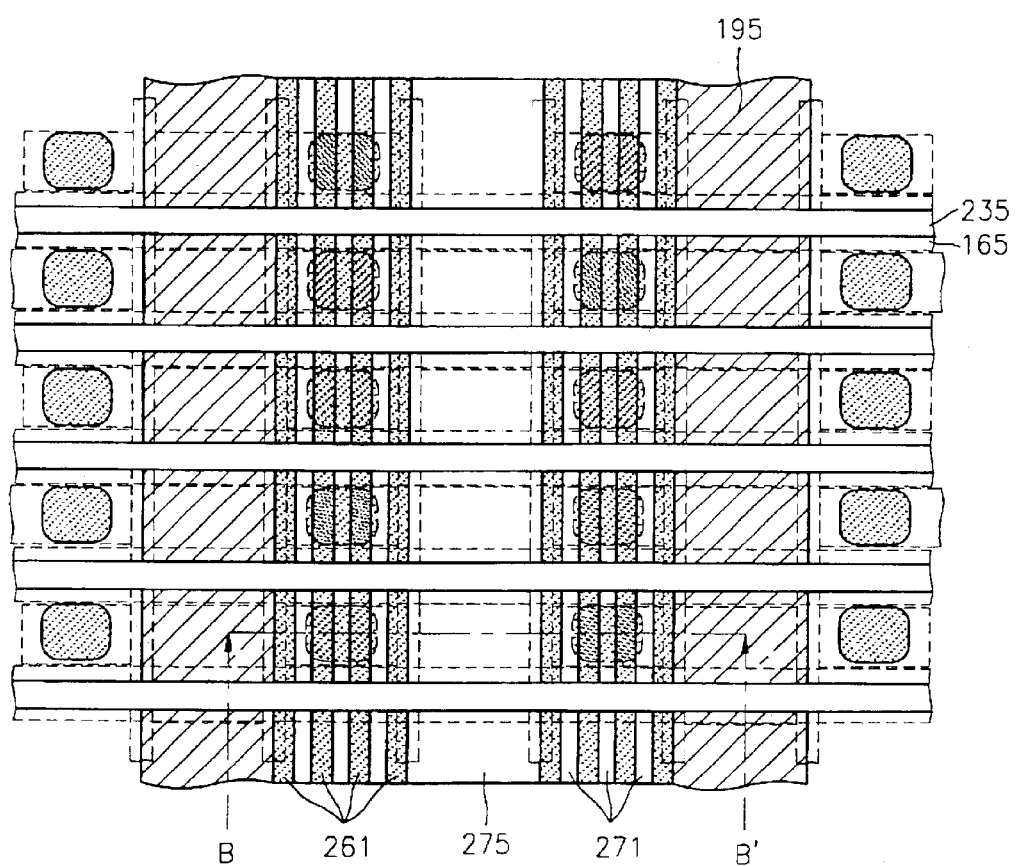

Referring to FIG. 6C, in order to define the storage node electrodes in each cell, grooves 235 are formed by patterning portions of the mold oxide layer patterns 196, the conductive line patterns 261, and the insulating line patterns 271 and 275. Here, the grooves 235 are formed to overlap the bit line structures 165. Accordingly, grooves 235 and the insulating spacers 275 separate the conductive line patterns 261 in units of unit cell.

Figure 6D:
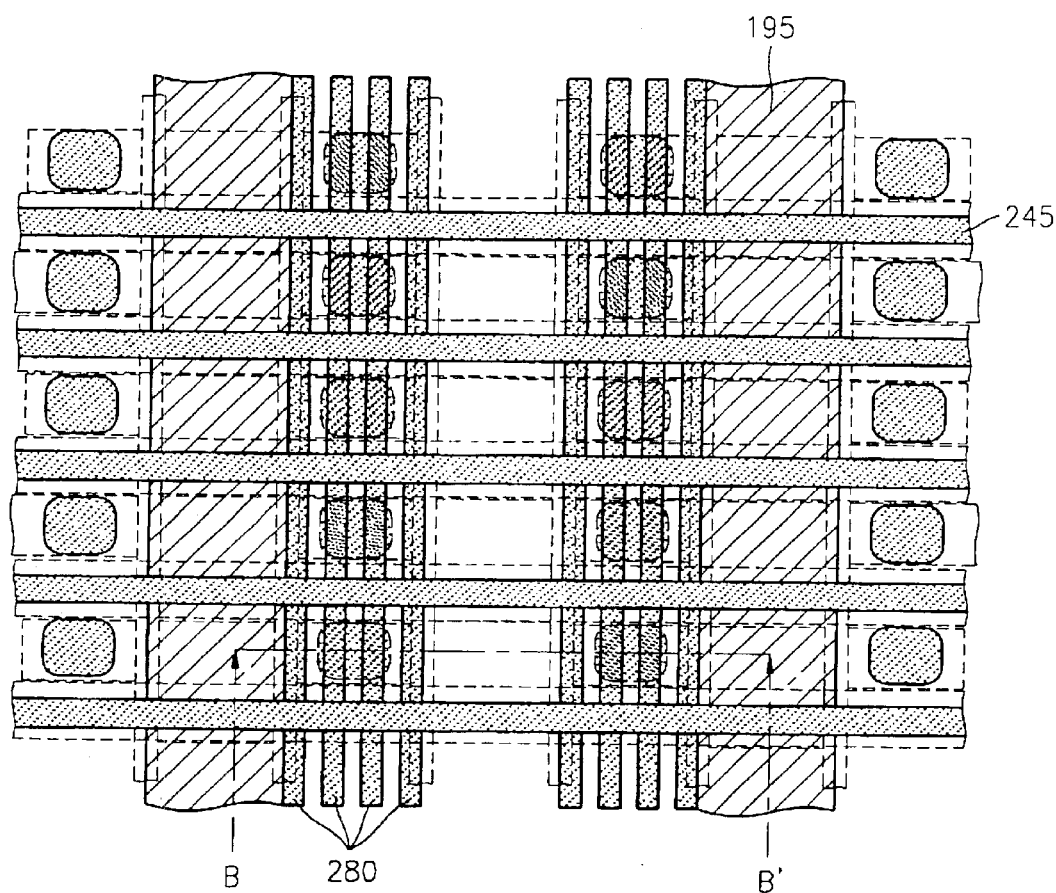
Figure 8:
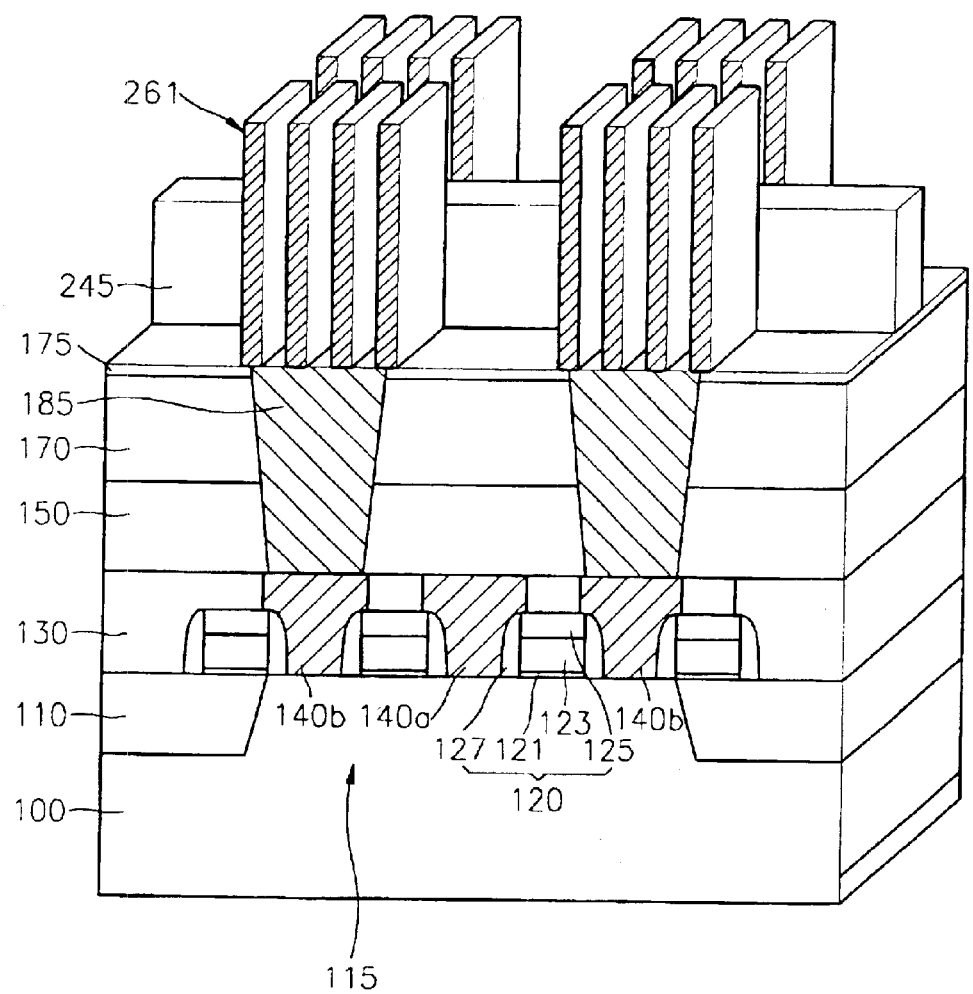
FIG. 8 is a perspective view illustrating a semiconductor memory device according to the second embodiments of the present invention.

Referring to FIGS. 6D and 8, an insulating layer for supporters is deposited to sufficiently fill the grooves 235, and the insulating layer is etched to a height smaller than the height of the conductive line patterns 261 so as to form supporters 245. In some embodiments, the insulating layer filled in the grooves 235 is formed of an insulating layer having an etching selectivity different from the etching selectivities of the mold oxide layer patterns 196 and the insulating line patterns 271 and 275. Since the supporters 245 cross through the conductive line patterns 261, the supporters 245 separate the conductive line patterns 261 according to cell. Furthermore, the supporters 245 prevent the conductive line patterns 261 from falling or bending toward the adjacent conductive line patterns 261. In addition, the supporters 245 are formed to a height smaller than the height of the conductive line patterns 261 in order to secure storage node electrode capacitance.

Thereafter, the mold oxide layer patterns 196 and the insulating line patterns 271 and 275 are removed by a conventional wet etching method. Here, since the mold oxide layer patterns 196 and the insulating line patterns 271 and 275 have an etching selectivity different from the etching selectivities of the etch stoppers 175 and the supporters 245, the mold oxide layer patterns 196 and the insulating line patterns 271 and 275 are selectively removed. Thus, storage node electrodes 280 are completed.

The effects of the second embodiments can be the same as those of the first embodiments.

Third Embodiments

Figure 10A:
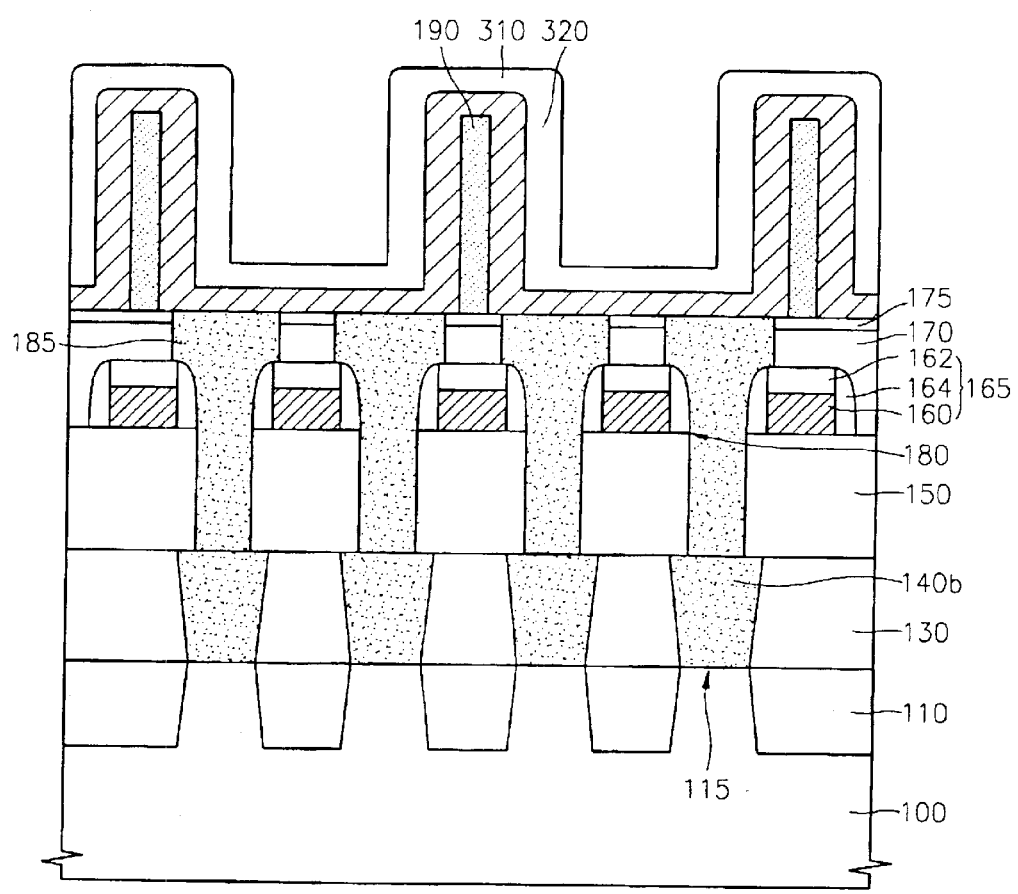
FIGS. 10A through 10C are sectional views of stages in the manufacture of a semiconductor memory device according to third embodiments of the present invention.
Figure 10B:
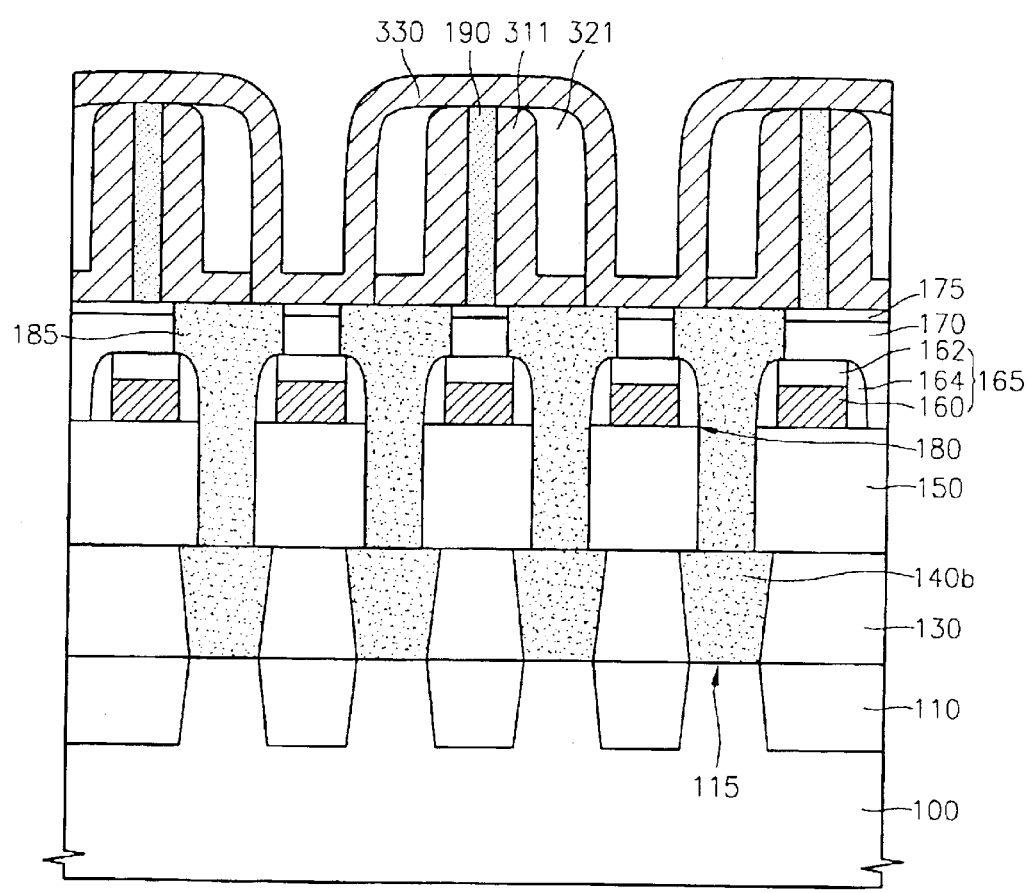
Figure 10C:
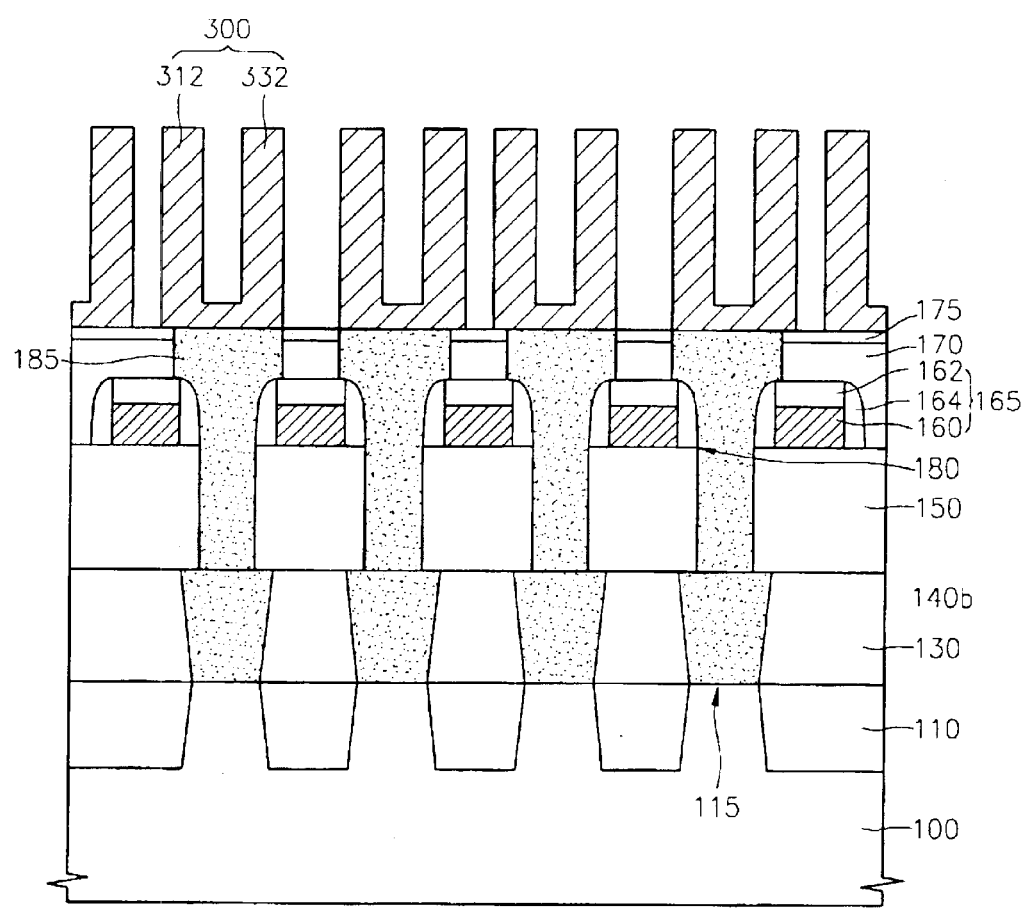

FIGS. 10A through 10C are sectional views of stages in the manufacture of a semiconductor memory device according to third embodiments of the present invention. The descriptions of the elements that are the same as the first and second embodiments will not be repeated, and the same reference numerals are allotted for the same elements of the first and second embodiments. In addition, the present embodiments include a method for forming storage node electrodes where the processes performed up until forming mold oxide layer patterns are the same as the processes of the first embodiments, thus the description will begin with the subsequent processes.

Referring to FIG. 10A, a first conductive layer 310 for storage node electrodes is formed on etch stoppers 175 on which mold oxide layer patterns 190 are formed. Thereafter, an insulating layer 320 is deposited on the first conductive layer 310.

The first conductive layer 310 and the insulating layer 320 are anisotropically etched to form first conductive spacers 311 and insulating spacers 321 as shown in FIG. 10B. A second conductive layer 330 for storage node electrodes is deposited on the resultant structure. Here, the first conductive spacers 311 contact storage node contact plugs 185.

Next, by anisotropically etching the second conductive layer 330, second conductive spacers (not shown) are formed on the sidewalls of the insulating spacers 321. Here, the second conductive spacers contact the storage node contact plugs 185 while contacting the sidewalls of the first conductive spacers 311. As shown in FIG. 10C, the surface of the resultant structure is chemical mechanical polished to form first conductive line patterns 312 formed of the first conductive spacers 311 and second conductive line patterns 332 formed of the second conductive spacers. Here, the first conductive line patterns 312 are formed into an L-shape and portions of the second conductive line patterns 332 contact the lower portions of the first conductive line patterns 312. Thereafter, the insulating spacers 321 and the mold oxide layer patterns 190 are removed by a conventional wet etching method. Accordingly, storage node electrodes 300 formed of the first and second conductive line patterns 312 and 332 are formed.

Here, the storage node electrodes 300 are formed of two conductive line patterns; however, the widths and the numbers of the conductive line patterns can be varied.

In addition, the mold oxide layer is formed to be parallel to the bit line structures in the present embodiments; however, the mold oxide layer can be formed to be parallel to the word line structures as shown in the second embodiments.

Fourth Embodiments

Figure 11A:
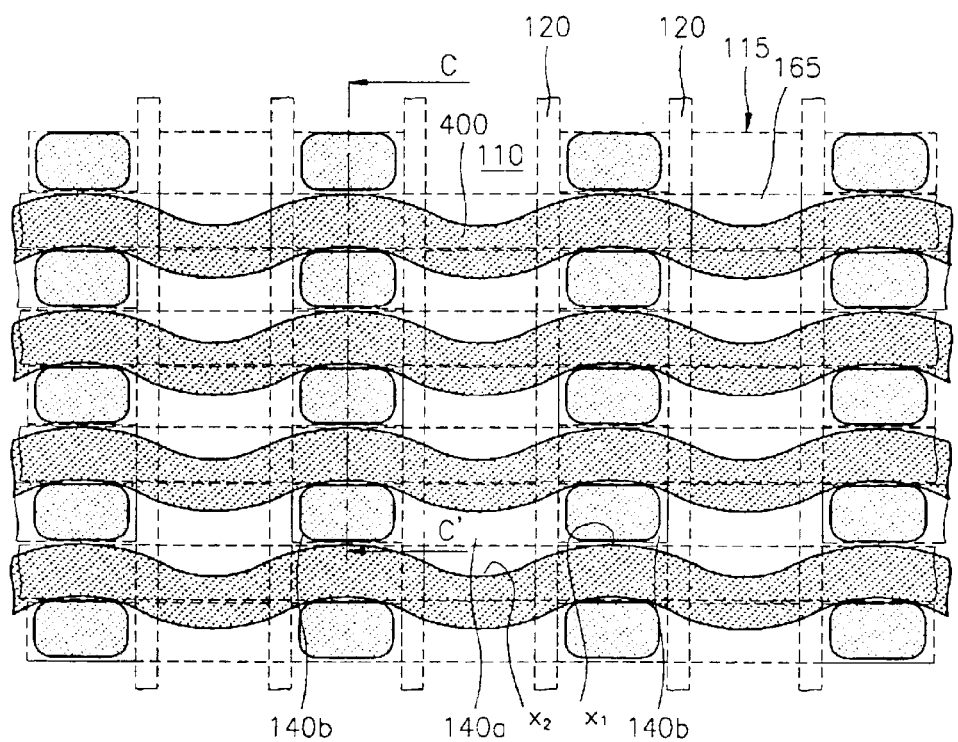
FIGS. 11A through 11D are plan views of stages in the manufacture of a semiconductor memory device according to fourth embodiments of the present invention.
Figure 11B:
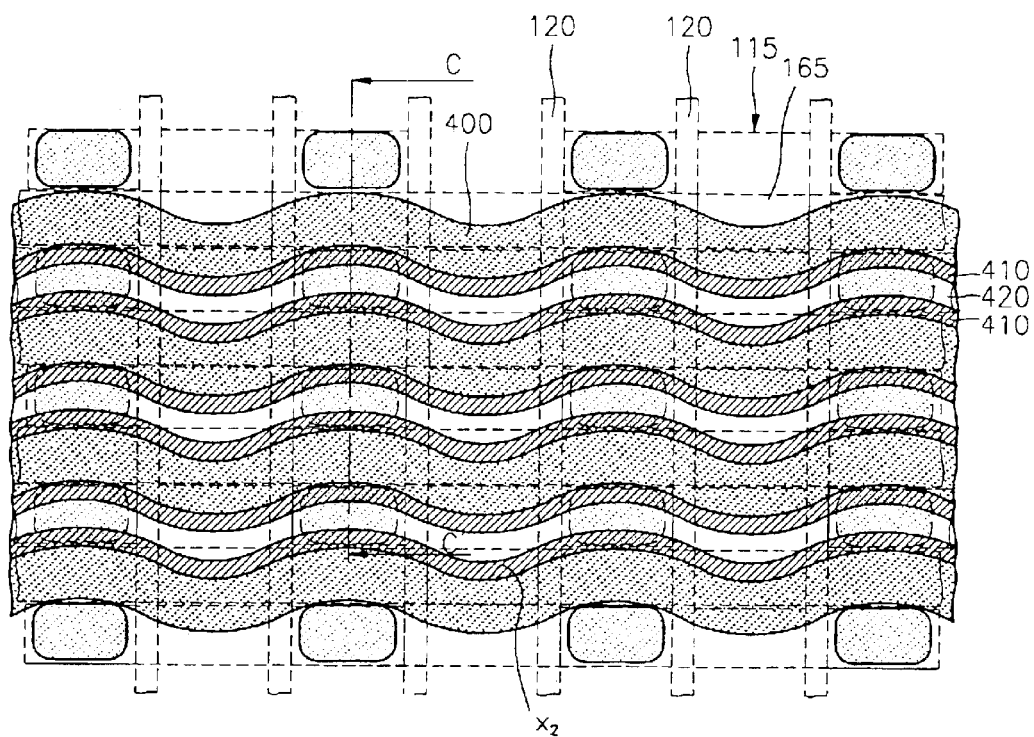
Figure 12A:
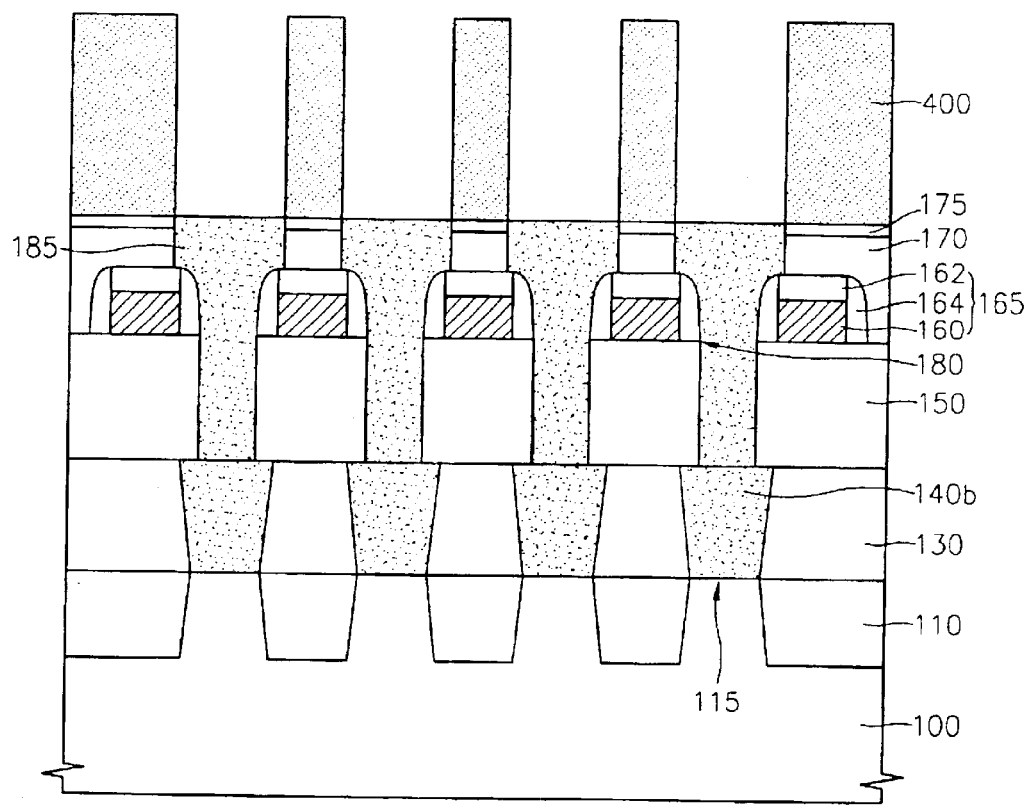
FIGS. 12A and 12B are sectional views of stages in the manufacture of a semiconductor memory device according to the fourth embodiments of the present invention.
Figure 12B:
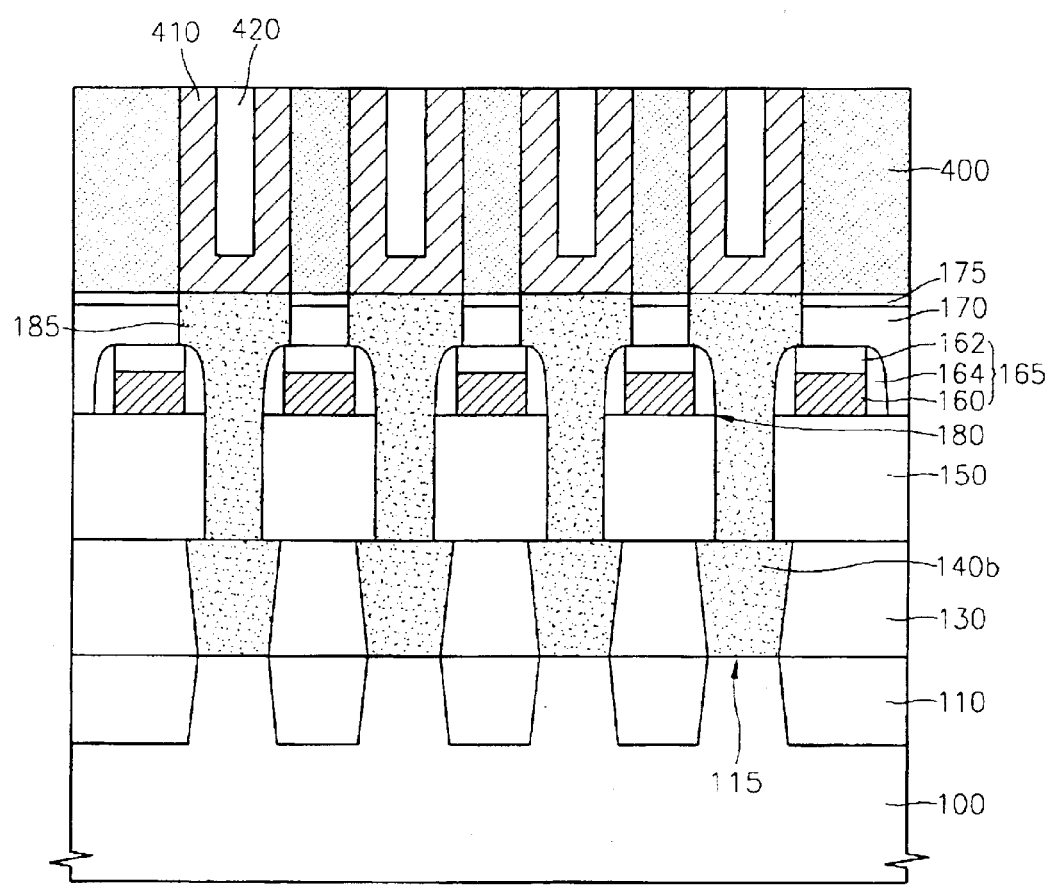

FIGS. 12A and 12B are the sectional views cut along lines C–C' of FIGS. 11A and 11B, respectively.

The descriptions of the elements that are the same as the first through third embodiments will not be repeated, and the same reference numerals are allotted for the same elements of the first through third embodiments. In addition, in the present embodiments, the processes performed up until forming storage node contact plugs are the same as the processes of the first through third embodiments, thus the description will begin with the subsequent processes.

Referring to FIGS. 11A and 12A, a mold oxide layer is formed on storage node contact plugs 185 and etch stoppers 175 to a predetermined thickness. Here, the mold oxide layer for determining the height of storage node electrodes can be formed to the desired height of the storage node electrodes. Thereafter, portions of the mold oxide layer are dry etched to form a plurality of mold oxide layer patterns 400. Here, the mold oxide layer patterns 400 are formed in, for example, one-pitch intervals, while being formed in the shape of waves on a plan view. In other words, ridge portions $X_1$ of the mold oxide layer patterns 400 located between the storage node contact plugs 185 and valley portions $X_2$ of the mold oxide layer patterns 400 are located on drain regions, which correspond to first contact pads 140a, or on an isolation layer 110 corresponding to the drain regions. When connecting the ridge portions $X_1$ of the wave-shaped mold oxide layer patterns 400, straight lines are formed. In addition, in some embodiments, the straight lines are parallel to bit lines structures 165.

As shown in FIGS. 11B and 12B, a conductive layer 410 for storage node electrodes, for example, a doped polysilicon layer, is deposited on etch stoppers 175 on which the wave-shaped mold oxide layer patterns 400 are formed, and a buffer insulating layer 420 is deposited on the conductive layer 410 for storage node electrodes. Thereafter, a chemical mechanical polishing is performed to expose the mold oxide layer patterns 400. Accordingly, the conductive layer 410 for storage node electrodes remains in a region defined by the mold oxide layer patterns 400. Here, the sidewalls of the remaining conductive layer 410 for storage node electrodes have the same wave shape as the mold oxide layer patterns 400.

Figure 11C:
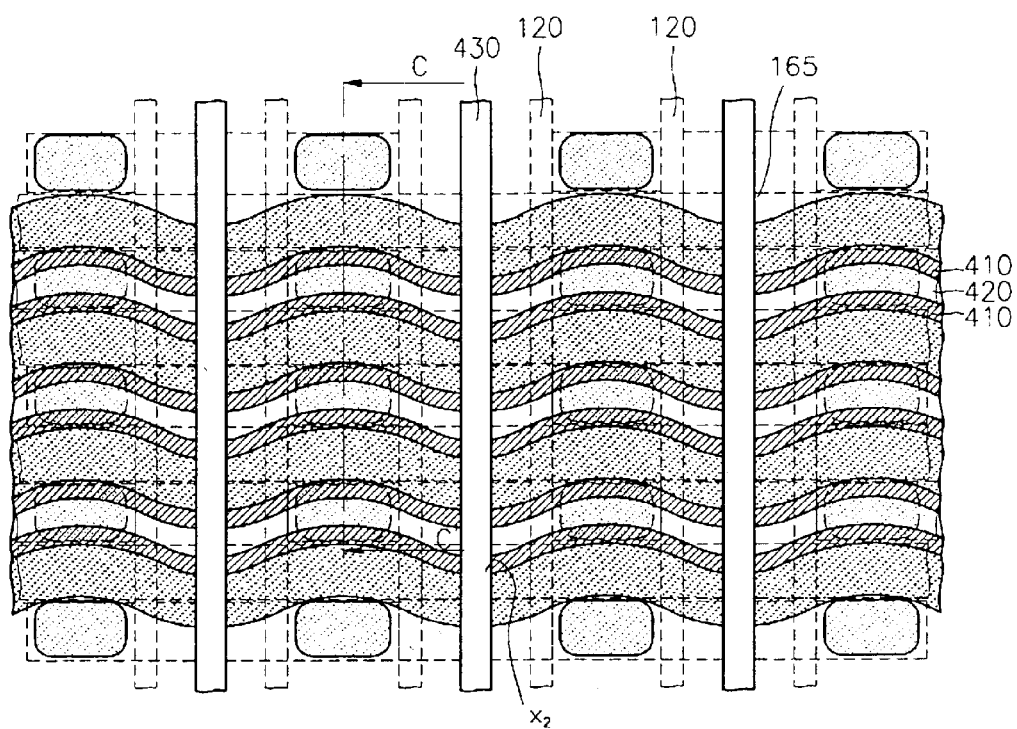
Figure 13:
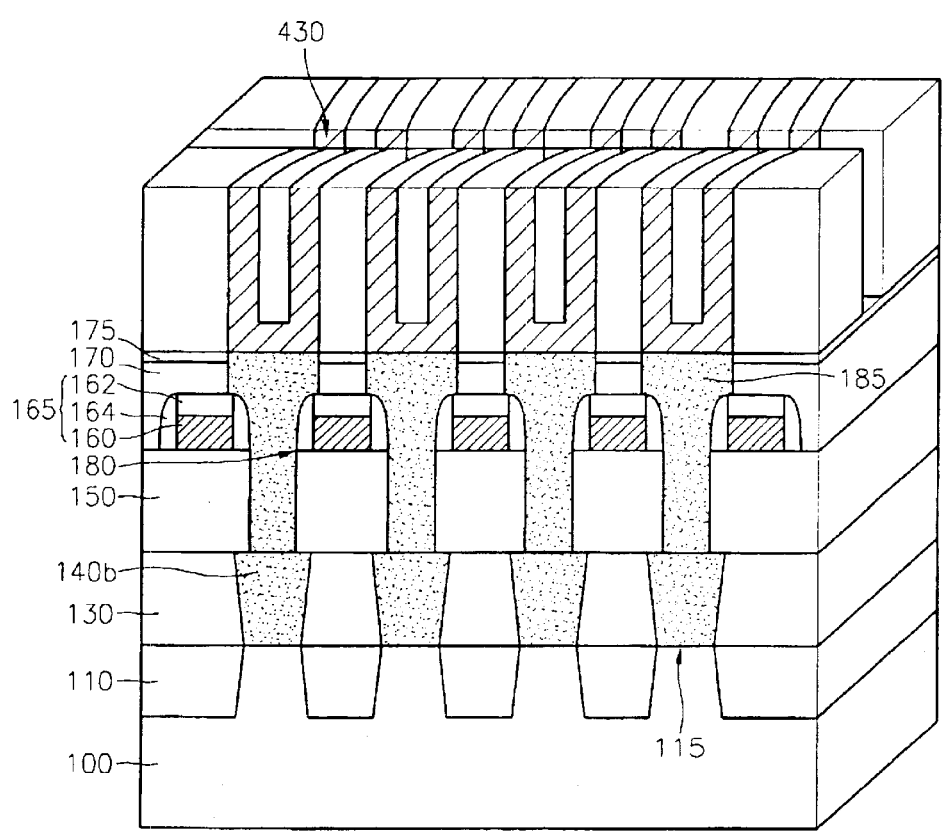
FIGS. 13 and 14 are perspective views illustrating a semiconductor memory device according to the fourth embodiments of the present invention.

Next, as shown in FIGS. 11C and 13, grooves 430 are formed by dry etching portions of the mold oxide layer patterns 400, the conductive layer 410 for storage node electrodes, and the insulating layer 420 in order to separate the storage node electrodes by cell. Here, the grooves 430 are formed between word line structures 120, on which drain regions (not shown) are formed, while being perpendicular to the extending direction of the mold oxide layer patterns 400, i.e., the direction of bit line structures. It is preferable that the grooves 430 pass through the valley portions $X_2$ of the mold oxide layer patterns 400.

Figure 11D:
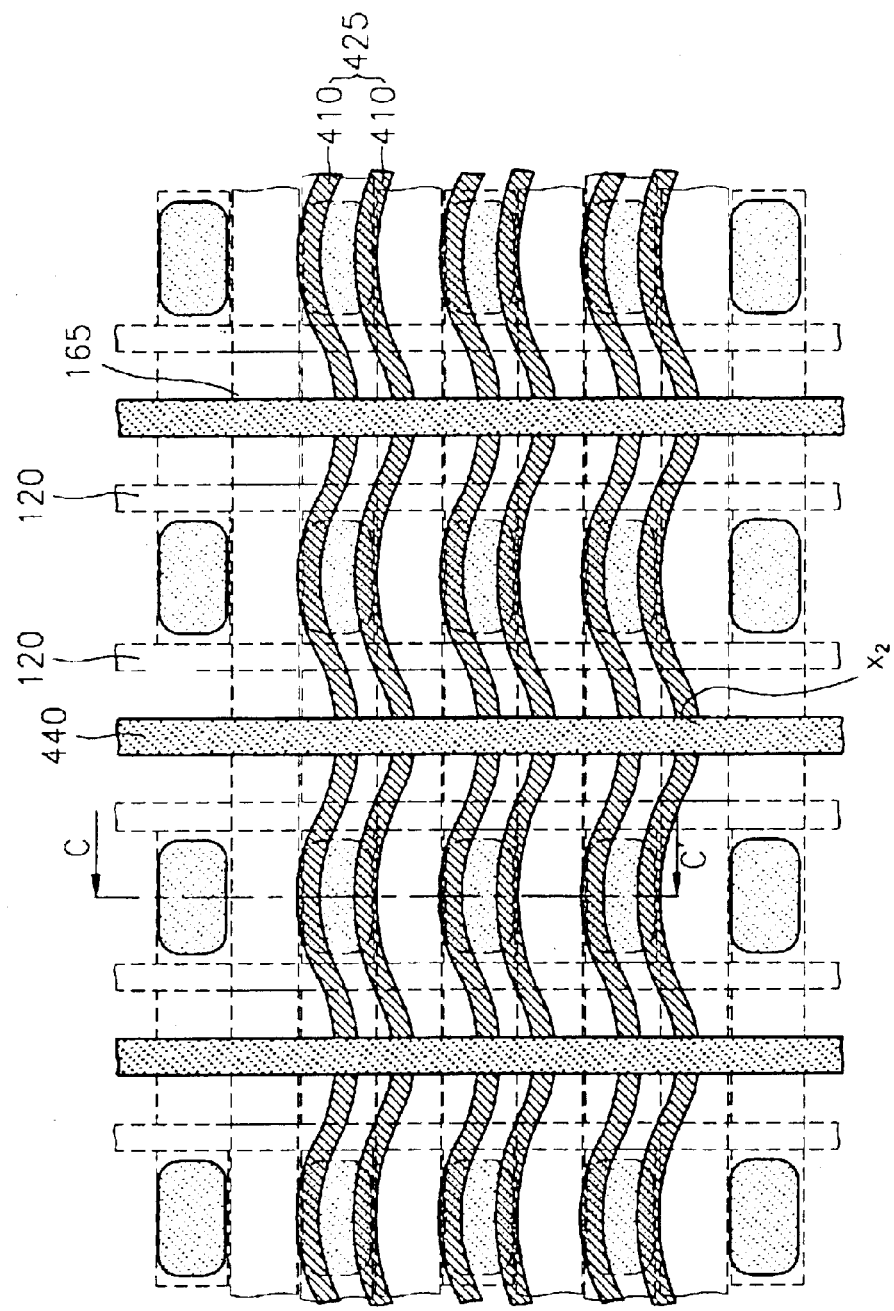
Figure 14:
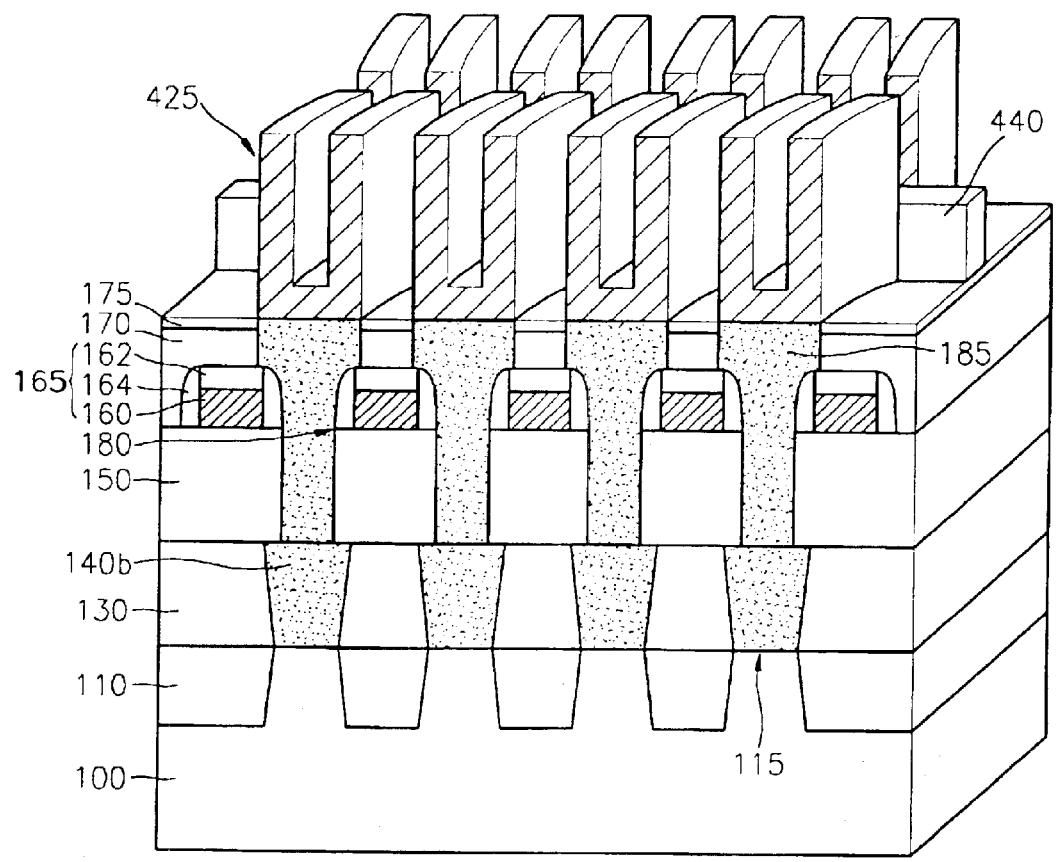

Thereafter, as shown in FIGS. 11D and 14, an insulating layer for supporters is deposited to sufficiently fill the grooves 430. Here, the insulating layer for supporters can be formed of the same material as the etch stoppers 175, for example, a silicon nitride layer. The insulating layer is wet or dry etched to a predetermined thickness so that the insulating layer is remained in the grooves 430 to a height smaller than the height of the conductive layer 410 for storage node electrodes or the mold oxide layer patterns 400. Accordingly, supporters 440 are formed.

The mold oxide layer patterns 400 and the insulating layer 420 are removed by a conventional wet etching method to form storage node electrodes 425. Here, since the etch stoppers 175 are formed on the resultant structure on the semiconductor substrate 100 and the etching selectivity of the supporters 440 is different from the etching selectivities of the mold oxide layer patterns 400 and the insulating layer 420, only the mold oxide layer patterns 400 and the insulating layer 420 are selectively removed. Thus, the storage node electrodes 425 are defined in units of each cell. In other words, the storage node electrodes 425 are separated in units of each cell by the supporters 440 in a direction parallel to the word lines. In addition, the supporters 440 formed in specific intervals support the storage node electrodes 425, which are formed into wave-shaped line patterns. Therefore, the narrow and high storage node electrodes 425 are prevented from falling toward the adjacent storage node electrodes 425.

According to the present embodiments, since the storage node electrodes 425 are formed in the wave shape, the surface area of the storage node electrodes 425 increases. In addition, since the storage node electrodes 425 are extended to the drain regions or the regions corresponding to the drain regions, the surface area of the storage node electrodes 425 further increases.

Furthermore, since the supporters 440 are formed to separate the storage node electrodes 425 in units of each cell, the storage node electrodes 425 are reduced or prevented from falling or bending toward the adjacent storage node electrodes 425.

Figure 15:
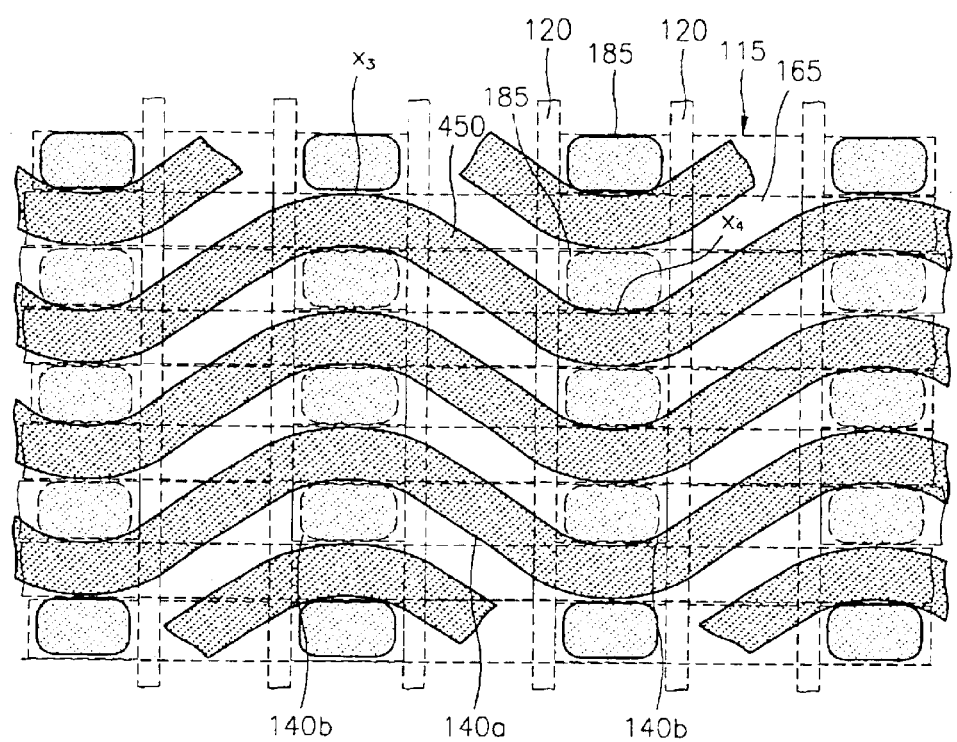
FIG. 15 is a plan view illustrating a modified semiconductor memory device according to the fourth embodiments of the present invention.

Here, the mold oxide layer patterns can be formed by changing the intervals of the wave as shown in FIG. 15.

Referring to FIG. 15, mold oxide layer patterns 450 are formed in the shape of waves in a plan view. Here, ridge portions $X_3$ and valley portions $X_4$ are formed to be located between storage node contact plugs 185. In this case, lines formed by connecting the ridge portions $X_3$ and lines formed by connecting the valley portions $X_4$ are parallel with one another by a predetermined distance, which is wider than the width of the active regions.

If the wave shape of the mold oxide layer patterns 450 is changed, the same effect is attained.

Figure 16:
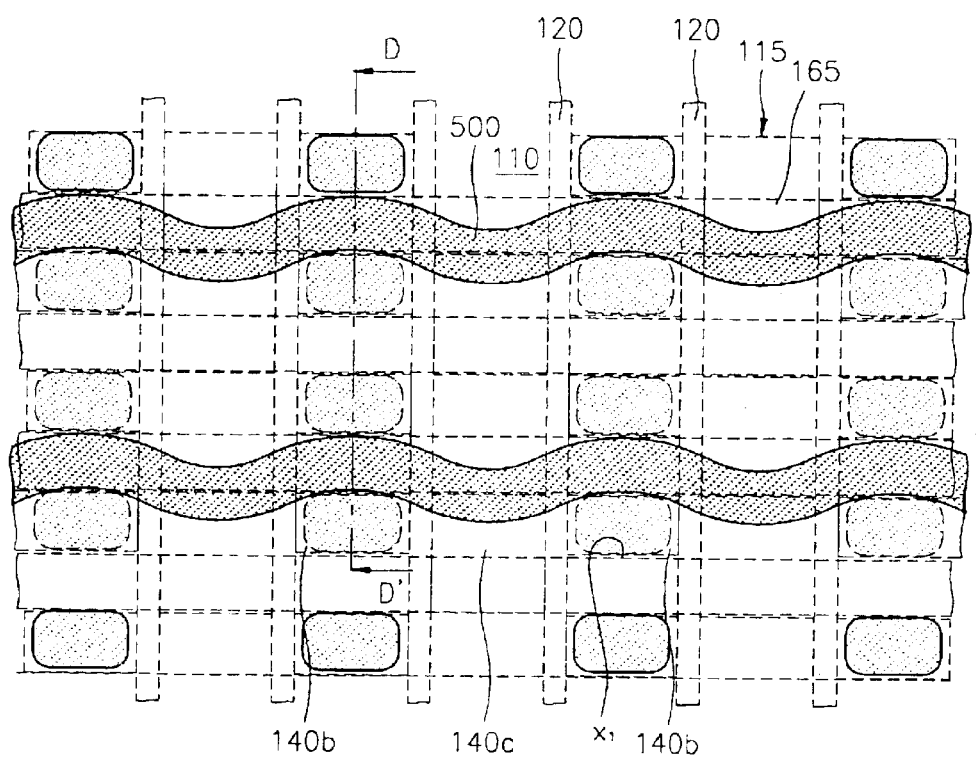
FIG. 16 is a plan view illustrating another modified semiconductor memory device according to the fourth embodiments of the present invention.

In addition, as shown in FIG. 16, mold oxide layer patterns 500 may be formed in two-pitch intervals. In other words, the mold oxide layer patterns 500 are arranged in two-pitch intervals as shown in the first embodiment while being formed in the shape of waves on a plan view. For example, in the mold oxide layer patterns 500, ridge portions $X_1$ may be located between storage node contact plugs 185, and valley portions $X_2$ may be located on drain regions, i.e., first contact regions, or on an isolation layer 110 corresponding to the drain regions. If the mold oxide layer patterns 500 in two-pitch intervals are formed, the same effect is attained.

In addition, storage node electrodes 425 can be formed by the method performed in the third embodiments.

Fifth Embodiments

Figure 17A:
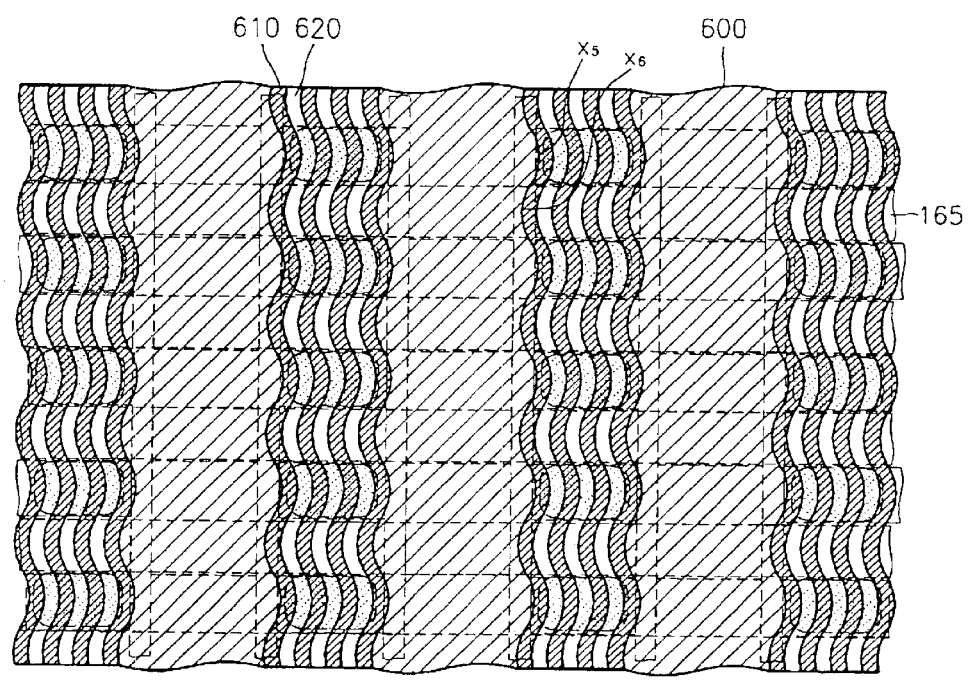
FIGS. 17A and 17B are plan views of stages in the manufacture of a semiconductor memory device according to fifth embodiments of the present invention.
Figure 17B:
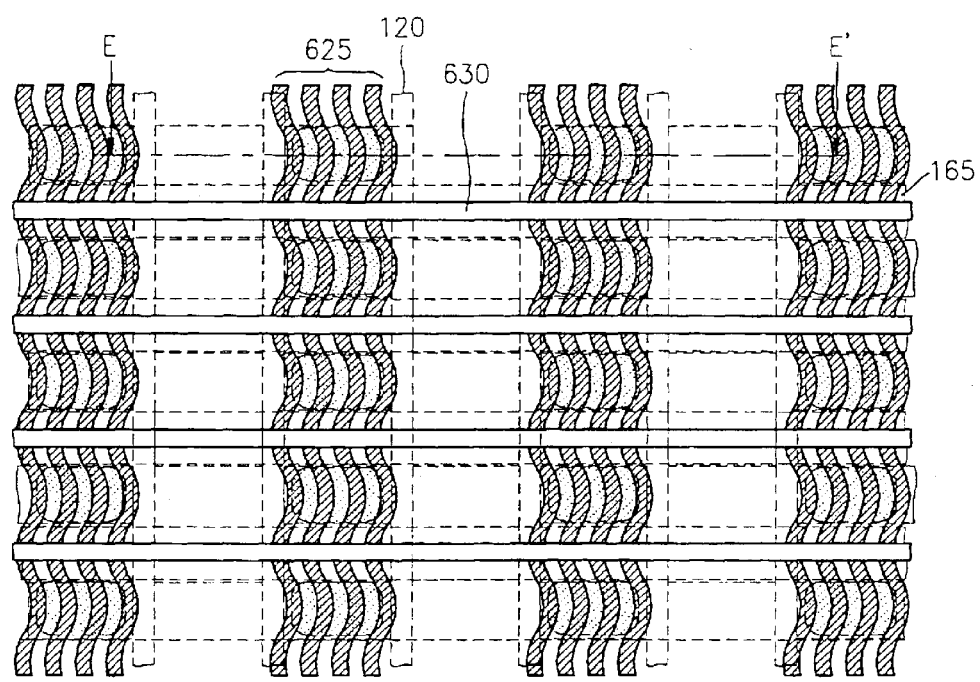

FIGS. 17A and 17B are plan views of stages in the manufacture of a semiconductor memory device according to fifth embodiments of the present invention. The processes performed up until forming etch stoppers 175 are the same as the processes of the first and second embodiments, thus the description will begin with the subsequent processes.

Referring to FIG. 17A, mold oxide layer patterns 600 are formed in the shape of waves in a plan view, on etch stoppers 175. Here, the mold oxide layer patterns 600 can be formed in, for example, one-pitch intervals. In other words, lines formed by connecting ridge portions $X_5$ or valley portions $X_6$ of the mold oxide layer patterns 600 are substantially parallel to word line structures 120. In addition, the mold oxide layer patterns 600 are formed to expose each of the storage node contact plugs 185 between the adjacent mold oxide layer patterns 600 on the same lines. The mold oxide layer patterns 600 are formed on regions without storage node contact plugs, i.e., on drain regions and on an isolation layer 110 corresponding to the drain regions.

A plurality of conductive line patterns 610 and insulating line patterns 620 are alternately formed between the mold oxide layer patterns 600. Here, the plurality of conductive line patterns 610 and insulating line patterns 620 are formed into waves according to the wave-shaped mold oxide layer patterns 600. In this case, the conductive line patterns 610 and the insulating line patterns 620 are formed by the above-described methods.

As shown in FIG. 17B, portions of the mold oxide layer patterns 600, the conductive line patterns 610, and the insulating line patterns 620 are etched to form grooves 630. The grooves 630 are formed on regions, which overlap bit line structures 165, in order to separate the conductive line patterns 610 in units of each cell. Here, the conductive line patterns 610 are defined in units of each cell by the grooves 630 and the mold oxide layer pattern 600, and the conductive line patterns 610 are formed into waves while contacting the storage node contact plugs 185.

Thereafter, supporters (not shown) are formed in the grooves 630 by the above-described method. The mold oxide layer patterns 600 and the insulating line patterns 620 are etched to form storage node electrodes 625.

If the mold oxide layer patterns 600 are formed to be parallel to the word line structures 120, the same effect may be attained.

Figure 18:
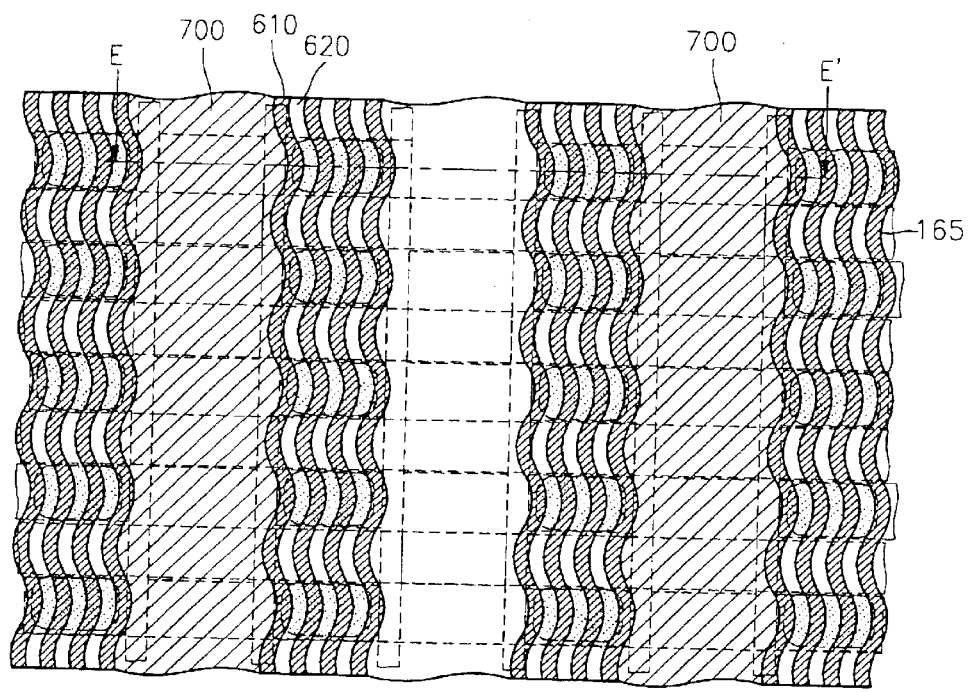
FIG. 18 is a plan view illustrating a modified semiconductor memory device according to the fifth embodiments of the present invention.

As shown in FIG. 18, the same effect may be attained by forming the mold oxide layer patterns 700 into waves in two-pitch intervals.

As described above, according to embodiments of the present invention, storage node electrodes are formed in a plurality of line pattern types having a fine line width. Thus, the surface area of the storage node electrodes can increase. In addition, the supporters formed of an insulating layer are formed to be perpendicular to the extending direction of the line patterns of the storage node electrodes. Therefore, the supporters separate the storage node electrodes in units of each cell, and the supporters support the storage node electrodes, thereby reducing or preventing the storage node electrodes from falling or bending toward the adjacent storage node electrodes.

Furthermore, the regions for forming the storage node electrodes may be increased so that the surface area of the storage node electrodes may be increased.

While this invention has been particularly shown and described with reference to preferred embodiments thereof, it will be understood by those skilled in the art that various changes in form and details may be made therein without departing from the spirit and scope of the invention as defined by the appended claims.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A semiconductor memory device comprising:

a semiconductor substrate;

an interlevel insulating layer on the semiconductor substrate;

storage node contact plugs in the interlevel insulating layer;

storage node electrodes, which comprise a plurality of conductive line patterns separated in predetermined intervals while having a predetermined height, contacting the storage node contact plugs;

wherein, the storage node electrodes are separated by insulating line patterns between selected storage node electrodes in units of a unit cell of the memory device; and supporters between the storage node electrodes and extending perpendicular to an extending direction of the conductive line patterns of the storage node electrodes.

2. A semiconductor memory device comprising:

a semiconductor substrate;

an interlevel insulating layer on the semiconductor substrate;

storage node contact plugs in the interlevel insulating layer; and storage node electrodes, which comprise a plurality of conductive line patterns separated in predetermined intervals while having a predetermined height, contacting the storage node contact plugs;

wherein, the storage node electrodes are separated by insulating line patterns between selected storage node electrodes in units of a unit cell of the memory device; and wherein the line patterns comprise straight lines on a plan view.

3. A semiconductor memory device comprising:

a semiconductor substrate;

an interlevel insulating layer on the semiconductor substrate;

storage node contact plugs in the interlevel insulating layer; and storage node electrodes, which comprise a plurality of conductive line patterns separated in predetermined intervals while having a predetermined height, contacting the storage node contact plugs;

wherein, the storage node electrodes are separated by insulating line patterns between selected storage node electrodes in units of a unit cell of the memory device; and wherein the line patterns comprise waves on a plan view.

4. The semiconductor memory device of claim 1, wherein the supporters have a height smaller than the height of the line patterns.

5. The semiconductor memory device of claim 1, wherein the supporters comprise insulating layers.

6. The semiconductor memory device of claim 1, wherein etch stoppers are further included on the interlevel insulating layer and the storage node contact plugs extend to the surfaces of the etch stoppers.

7. A semiconductor memory device comprising:

a semiconductor substrate including a plurality of active regions, a plurality of word line structures passing over the active regions, source and drain regions on the active regions at respective sides of the word line structures, and a plurality of bit line structures crossing the word line structures, electrically connecting to the drain regions, and passing between the active regions;

an interlevel insulating layer on the semiconductor substrate;

etch stoppers on the interlevel insulating layer;

storage node contact plugs in the interlevel insulating layer and the etch stoppers;

storage node electrodes, which comprise a plurality of conductive line patterns separated in predetermined intervals while having a predetermined height, contacting the storage node contact plugs; and supporters between the storage node electrodes and extending perpendicular to an extending direction of the line patterns of the storage node electrodes;

wherein, the plurality of line patterns comprise straight lines.

8. The semiconductor memory device of claim 7, wherein the conductive line patterns are extended to be substantially parallel to the bit line structures; and the supporters are substantially parallel to the word line structures and pass over the drain regions between the word line structures and an isolation layer corresponding to the drain regions.

9. The semiconductor memory device of claim 7, wherein the conductive line patterns are extended to be substantially parallel to the word line structures; and the supporters are substantially parallel to the bit line structures and overlap each of the bit line structures.

10. The semiconductor memory device of claim 7, wherein the supporters have a height smaller than the height of the line patterns.

11. The semiconductor memory device of claim 7, wherein the supporters comprise insulating layers.

12. A semiconductor memory device comprising:

a semiconductor substrate including a plurality of active regions, a plurality of word line structures passing over the active regions, source and drain regions on the active regions at respective sides of the word line structures, and a plurality of bit line structures crossing the word line structures, electrically connecting to the drain regions, and passing between the active regions;

an interlevel insulating layer on the semiconductor substrate;

etch stoppers on the interlevel insulating layer;

storage node contact plugs in the interlevel insulating layer and the etch stoppers;

storage node electrodes, which comprise a plurality of conductive line patterns separated in the same intervals while having a specific height, contacting the storage node contact plugs; and supporters between the storage node electrodes and extending perpendicular to an extending direction of the line patterns of the storage node electrodes;

wherein, the plurality of line patterns comprise waves in a plan view.

13. The semiconductor memory device of claim 12, wherein the conductive line patterns are extended to be substantially parallel to the bit line structures; and the supporters are substantially parallel to the word line structures and pass over the drain regions between the word line structures and an isolation layer corresponding to the drain regions.

14. The semiconductor memory device of claim 12, wherein the conductive line patterns are extended to be substantially parallel to the word line structures; and the supporters are substantially parallel to the bit line structures and overlap each of the bit line structures.

15. The semiconductor memory device of claim 12, wherein the supporters have a height smaller than the height of the line patterns.

16. The semiconductor memory device of claim 12, wherein the supporters comprise insulating layers.

17. A storage node for a semiconductor memory device comprising:

a pair of spaced apart mold oxide layer patterns on a semiconductor memory device substrate that define facing mold oxide layer pattern sidewalls;

a pair of first conductive spacers, a respective one of which is on a respective one of the facing mold oxide layer pattern sidewalls and face one another;

a pair of first insulating spacers, a respective one of which is on a respective one of the pair of first conductive spacers, opposite the respective one of the facing mold oxide layer pattern sidewalls;

a pair of second conductive spacers, a respective one of which is on a respective one of the pair of first insulating spacers, opposite the respective one of the pair of first conductive spacers; and at least one second insulating spacer between the pair of second conductive spacers.

18. A storage node according to claim 17 wherein the at least one insulating spacer is a single insulating spacer that extends between the pair of second conductive spacers.

19. A storage node for a semiconductor memory device comprising:

a plurality of freestanding storage node electrodes that project away from an outer surface of a semiconductor memory substrate by a first distance; and a supporter that is configured to support at least one of the freestanding storage node electrodes and that projects away from the outer surface of the semiconductor memory substrate by a second distance that is less than the first distance.

20. A storage node according to claim 19 wherein the plurality of freestanding storage nodes extend along two spaced apart rows and wherein the supporter extends between the two spaced apart rows.

* * * * *